(12) United States Patent
Basker et al.

(10) Patent No.: US 7,776,680 B2
(45) Date of Patent: Aug. 17, 2010

(54) COMPLEMENTARY METAL OXIDE SEMICONDUCTOR DEVICE WITH AN ELECTROPLATED METAL REPLACEMENT GATE

(75) Inventors: Veeraraghavan S. Basker, Albany, NY (US); John M. Cotte, New Fairfield, CT (US); Hariklia Deligianni, Tenafly, NJ (US); Toshiharu Furukawa, Essex Junction, VT (US); Vamsi K. Paruchuri, New York, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 399 days.

(21) Appl. No.: 11/968,885

(22) Filed: Jan. 3, 2008

(65) Prior Publication Data

US 2009/0275179 A1 Nov. 5, 2009

(51) Int. Cl.
*H01L 21/8238* (2006.01)
(52) U.S. Cl. ............... 438/231; 438/199; 438/217; 438/232; 438/301; 438/305; 257/E21.621; 257/E21.635
(58) Field of Classification Search .......... 438/229, 438/332, 369; 257/338
See application file for complete search history.

(56) References Cited

U.S. PATENT DOCUMENTS 6,171,910 B1   1/2001   Hobbs et al.
6,475,908 B1 * 11/2002   Lin et al. .................. 438/659
6,858,483 B2 *  2/2005   Doczy et al. .............. 438/199
2006/0166474 A1 7/2006   Vereecken et al.
2007/0152276 A1 7/2007   Arnold et al.

OTHER PUBLICATIONS

PCT Notification of Transmittal of the International Search Report, International Appln. No. PCT/US/08/87902, Feb. 13, 2009, pp. 1-10.

* cited by examiner

*Primary Examiner*—N Drew Richards
*Assistant Examiner*—Kyoung Lee
(74) *Attorney, Agent, or Firm*—Gibb I.P. Law Firm, LLC; Yuanmin Cai

(57) ABSTRACT

Disclosed herein are embodiments of a method of forming a complementary metal oxide semiconductor (CMOS) device that has at least one high aspect ratio gate structure with a void-free and seam-free metal gate conductor layer positioned on top of a relatively thin high-k gate dielectric layer. These method embodiments incorporate a gate replacement strategy that uses an electroplating process to fill, from the bottom upward, a high-aspect ratio gate stack opening with a metal gate conductor layer. The source of electrons for the electroplating process is a current passed directly through the back side of the substrate. This eliminates the need for a seed layer and ensures that the metal gate conductor layer will be formed without voids or seams. Furthermore, depending upon the embodiment, the electroplating process is performed under illumination to enhance electron flow to a given area (i.e., to enhance plating) or in darkness to prevent electron flow to a given area (i.e., to prevent plating).

25 Claims, 26 Drawing Sheets

COMPLEMENTARY METAL OXIDE SEMICONDUCTOR DEVICE WITH AN ELECTROPLATED METAL REPLACEMENT GATE

BACKGROUND

1. Field of the Invention

The embodiments of the invention generally relate to complementary metal oxide semiconductor (CMOS) devices and, more particularly, to a method of forming a CMOS device having an electroplated high-aspect ratio metal replacement gate.

2. Description of the Related Art

Prior art complementary metal oxide semiconductor (CMOS) technologies are typically manufactured with a gate stack that includes a thin silicon oxide ($SiO_2$) gate dielectric layer and a doped-polysilicon gate conductor layer. With device size scaling, the desired gate dielectric thickness has been reduced. Unfortunately, doped polysilicon gate conductors are subject to depletion effects and, thereby increase the effective gate dielectric thickness. Thus, conventional gate structures are not suitable for future CMOS technology generations and, more particularly, for CMOS technology generations beyond the 65 nm node. Rather in order to realize the power requirements of CMOS transistors at the 65 nm node and beyond, gates stacks that include a metal gate conductor layer, which is not subject depletion effects, as well as a high-k dielectric layer, which minimizes gate leakage current, will be required. Therefore, there is a need in the art for a CMOS device structure and a method of forming the structure that incorporates a high-k gate dielectric-metal gate conductor gate stack.

SUMMARY

Disclosed herein are embodiments of a method of forming a complementary metal oxide semiconductor (CMOS) device that has at least one high aspect ratio gate structure with a void-free and seam-free metal gate conductor layer positioned on top of a relatively thin high-k gate dielectric layer. These method embodiments incorporate a gate replacement strategy that uses an electroplating process to fill, from the bottom upward, a high-aspect ratio gate stack opening with a metal gate conductor layer. The source of electrons for the electroplating process is a current passed directly through the back side of the substrate. This eliminates the need for a seed layer and ensures that the metal gate conductor layer will be formed without voids or seams. Furthermore, depending upon the embodiment, the electroplating process is performed under illumination to enhance electron flow to a given area (i.e., to enhance plating) or in darkness to prevent electron flow to a given area (i.e., to prevent plating).

One embodiment of the method comprises providing a p-type substrate, having a first section, a second section positioned laterally adjacent to the first section, and a back side. An NWELL can be formed in the first section. Then, a first gate stack can be formed on the first section above the NWELL and a second gate stack can be formed on the second section. These gates stacks can be formed such that they each comprise a dielectric layer adjacent to the substrate, an n-type metal layer adjacent to the dielectric layer and a polysilicon layer adjacent to the n-type metal layer. After the gate stacks are formed, conventional FET processing can be performed, including but not limited to, gate stack sidewall spacer and source/drain formation. Then, the polysilicon layer and the n-type metal layer can be removed from the first gate stack, but not from the second gate stack. Next, a p-type metal layer can be electroplated onto the dielectric layer of the first gate stack using a current applied to the back side of the substrate. This electroplating process should further be performed under illumination so as to ensure electron flow through the back side of the substrate and further through the NWELL to the first gate stack (i.e., to ensure that the p-type metal layer is electroplated).

Another embodiment of the method similarly comprises providing a p-type substrate, having a first section, a second section positioned laterally adjacent to the first section, and back side. An NWELL can be formed in the first section. Then, a first gate stack can be formed on the first section and a second gate stack can be formed on the second section. These gate stacks can be formed such that they each comprise a dielectric layer adjacent to the substrate and a polysilicon layer adjacent to the dielectric layer. After the gate stacks are formed, conventional FET processing can be performed, including but not limited to, gate stack sidewall spacer and source/drain formation. Then, the polysilicon layer can be removed from all the gate stacks. After the polysilicon layer is removed from all the gate stacks, the second gate stack can be masked and a p-type metal layer can be electroplated onto the dielectric layer of the first gate stack using a current applied to the back side of the substrate. This electroplating process should further be performed under illumination so as to ensure electron flow through the back side of the substrate and further through the NWELL to the first gate stack (i.e., to ensure that the p-type metal layer is electroplated onto the dielectric layer of the first gate stack). Once the p-type metal layer is electroplated, the first gate stack can be masked and an n-type metal layer can be electroplated onto the dielectric layer of the second gate stack.

Yet another embodiment of the method comprises providing an n-type substrate, having a first section, a second section positioned laterally adjacent to the first section, and a back side. A PWELL can be formed in the second section of the substrate. Then, a first gate stack can be formed on the first section and a second gate stack can be formed on the second section above the PWELL. These gate stacks can be formed such that they each comprise a dielectric layer adjacent to the substrate and a polysilicon layer adjacent to the dielectric layer. After the gate stacks are formed, conventional FET processing can be performed, including but not limited to, gate stack sidewall spacer and source/drain formation. Then, the polysilicon layer can be removed from all the gate stacks. After the polysilicon layer is removed for all the gate stacks, a p-type metal layer can be selectively electroplated onto the dielectric layer of the first gate stack using a current applied to the back side of the substrate. This electroplating process is further performed in darkness such that, when the current is applied to the back side of the substrate, electron flow passes through the substrate to the first gate stack, but not through the PWELL to the second gate stack (i.e., to prevent the p-type metal layer from plating onto the dielectric layer in the second gate stack). After the p-type metal layer is electroplated onto the dielectric layer of the first gate stack, another electroplating process is performed. Again, this electroplating process is performed using a current applied to the back side of the substrate. Specifically, an n-type metal layer is electroplated onto both the p-type metal layer of the first gate stack and onto the dielectric layer of the second gate stack. This electroplating process is further performed under illumination so as to ensure electron flow, not only from the power source through the back side of the substrate to the first gate stack, but also through the substrate and the PWELL to the second gate stack (i.e., to ensure that the n-type metal plates on both the first and second gate stacks).

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments without departing from the spirit thereof, and the embodiments include all such changes and modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
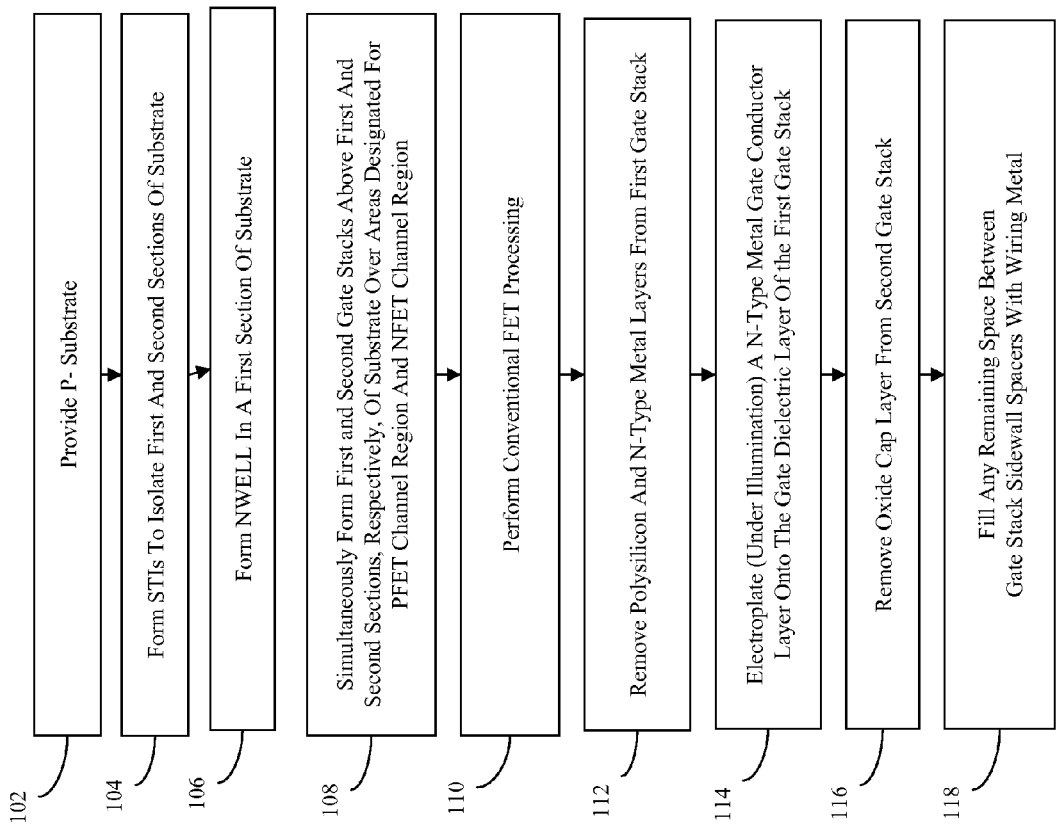
FIG. 1 is a flow diagram illustrating an embodiment of a method of forming a CMOS device 200 of FIG. 8.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, prior art complementary metal oxide semiconductor (CMOS) technologies are typically manufactured with a gate stack that includes a thin silicon oxide ($SiO_2$) gate dielectric layer and a doped-polysilicon gate conductor layer. With device size scaling, the desired gate dielectric thickness has been reduced. Unfortunately, the doped polysilicon gate conductors are subject to depletion effects and, thereby increase the effective gate dielectric thickness. Thus, conventional gate structures are not be suitable for future CMOS technology generations and, more particularly, for CMOS technology generations at and beyond the 65 nm node. Rather, in order to realize the power requirements of CMOS transistors at the 65 nm node and beyond, gates stacks that include a metal gate conductor layer, which is not subject depletion effects, as well as a high-k dielectric layer (e.g., a dielectric layer having a dielectric constant above 4), which minimizes gate leakage current, will be required. Therefore, there is a need in the art for a CMOS device structure and a method of forming the structure that incorporates a high-k gate dielectric-metal gate conductor gate stack.

Candidates for the metal gate conductor material that can be incorporated into such a gate stack must exhibit certain properties. Specifically, the metal gate conductor must be able to preserve the gate stack performance even when subjected to thermal budgeting. That is, gate conductor functioning must be stable during high temperature CMOS processing (e.g., during thermal anneals). Several p-type metals (e.g., rhenium (Re), platinum (Pt), ruthenium (Ru), etc.) and conducting metal oxides (e.g., $RuO_2$, $Re_2O_3$, etc.) are promising candidates for dual-metal gate electrodes for p-type transistor because of their high work-function. However, these materials have shown instability in work-function, when subjected to the high temperatures required for subsequent CMOS processing and, specifically, when subjected to high temperature implant activation anneals (e.g., >600° C.).

One suggested solution has been to incorporate a gate replacement strategy. For example, U.S. Pat. No. 6,858,483 of Doczy et al., issued on Feb. 22, 2005 and incorporated herein by reference, proposed forming conventional polysilicon gate conductors for both the n-type and p-type field effect transistors (FETs) of a CMOS device and then, after any required high temperature processing, replacing the polysilicon gate conductors with metal gate conductors. That is, after all the required high temperature processing is complete, polysilicon gate conductors corresponding to NFETs are removed and a replacement n-type metal gate conductor material is deposited (e.g., by physical vapor deposition (PVD), chemical vapor deposition (CVD) or atomic layer deposition (ALD). Then, following a polishing process, polysilicon gate conductors corresponding to the PFETs are removed and a replacement p-type metal gate conductor material is deposited (e.g., by PVD, CVD or ALD). Consequently, the maximum thermal budgeting that the metal gate would be required to withstand would be below approximately 550° C. This satisfies the condition for the metal gate candidates discussed above which have shown stability when temperatures are less than 600° C. Unfortunately, this technique is not suitable for CMOS technology generations at and beyond the 65 nm node because of the required high aspect ratio of the gate structures. Specifically, PVD, CVD and ALD fill techniques inevitably result in the formation of voids and/or seams (due to side fill), when filling high aspect ratio openings (e.g. openings with dimensions of 20 nm by 100 nm or greater). Such voids and seams negatively impact the gate stack performance and, thereby limit dimensional scaling.

In view of the foregoing, disclosed herein are embodiments of a method of forming a complementary metal oxide semiconductor (CMOS) device that has at least one high aspect ratio gate structure with a void-free and seam-free metal gate conductor layer positioned on top of a relatively thin high-k gate dielectric layer. These method embodiments incorporate a gate replacement strategy that uses an electroplating process to fill, from the bottom upward, a high-aspect ratio gate stack opening with a metal gate conductor layer. The source of electrons for the electroplating process is a current passed directly through the back side of the substrate. This eliminates the need for a seed layer and ensures that the metal gate conductor layer will be formed without voids or seams. Furthermore, depending upon the embodiment, the electroplating process is performed under illumination to enhance electron flow to a given area (i.e., to enhance plating) or in darkness to prevent electron flow to a given area (i.e., to prevent plating).

Figure 2:
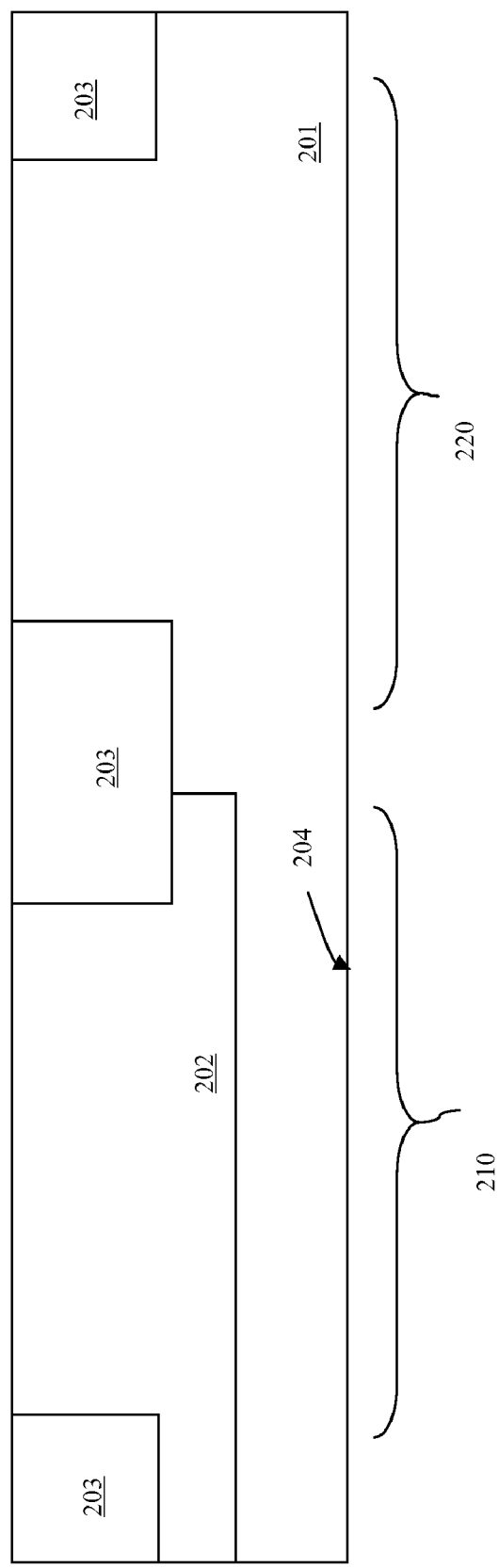
FIG. 2 is a cross-section diagram illustrating a partially-completed CMOS device formed according to the method of FIG. 1.
Figure 8:
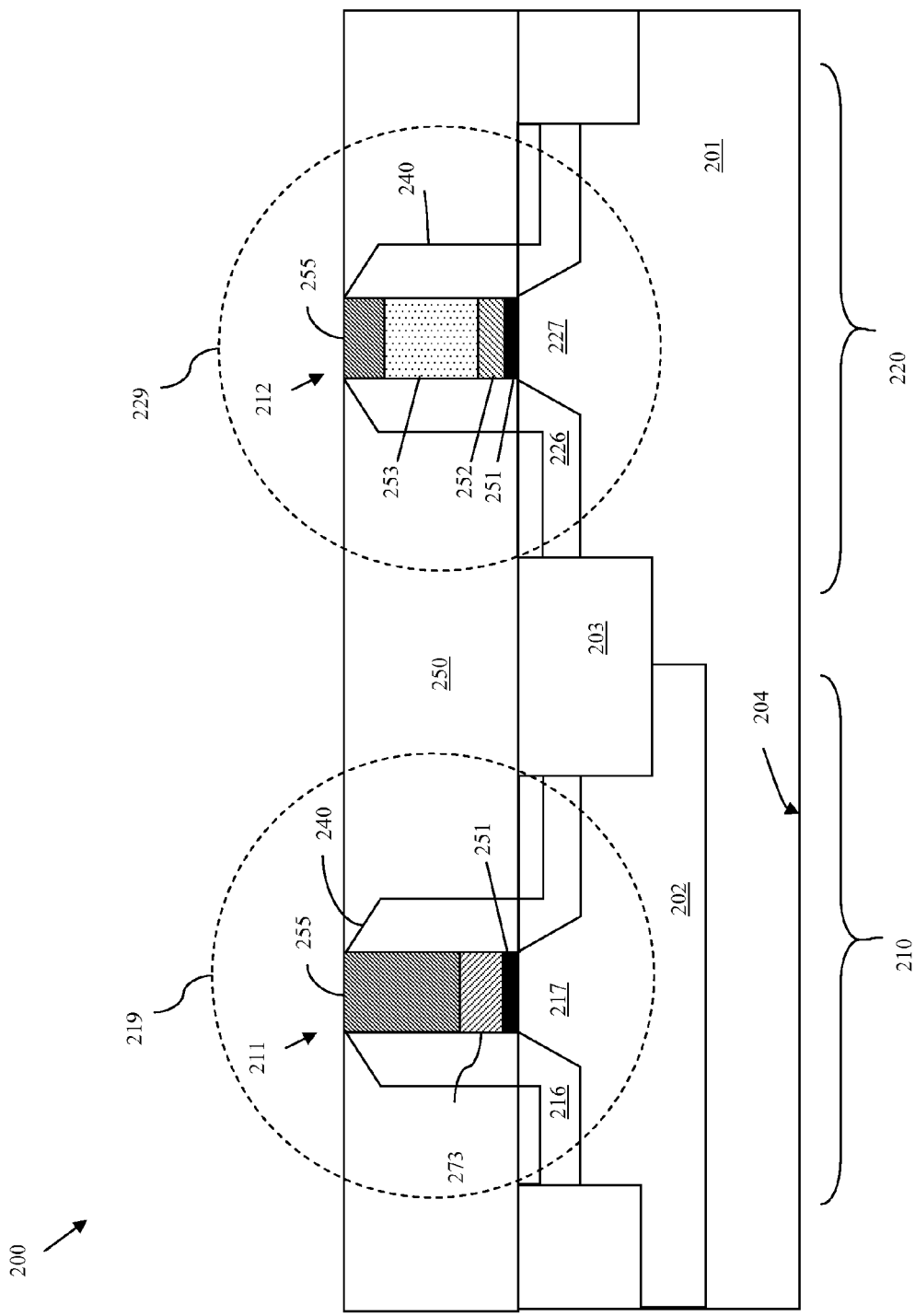
FIG. 8 is a cross-section diagram illustrating a CMOS device 200 formed according to the method of FIG. 1.

More particularly, FIG. 1 is a flow diagram illustrating an embodiment of a method for forming a CMOS device 200 illustrated in FIG. 8. The embodiment comprises providing a p-type substrate 201, having a first section 210 for PFET formation and a second section 220 for NFET formation positioned laterally adjacent to the first section 210 (102, see FIG. 2). Shallow trench isolation (STI) regions 203 can be formed, using conventional STI processing techniques, in order to isolate the first section 210 from the second section 220 of the substrate 201 (104, see FIG. 2). Next, an n-type well region 202 (NWELL) can be formed in the first section 210 (106, see FIG. 2). That is, conventional, masked, deep-implantation techniques can be used to implant an n-type dopant (e.g., arsenic (As), antimony (Sb) or phosphorous (P)) into the substrate 201 in the first section 210.

Figure 3:
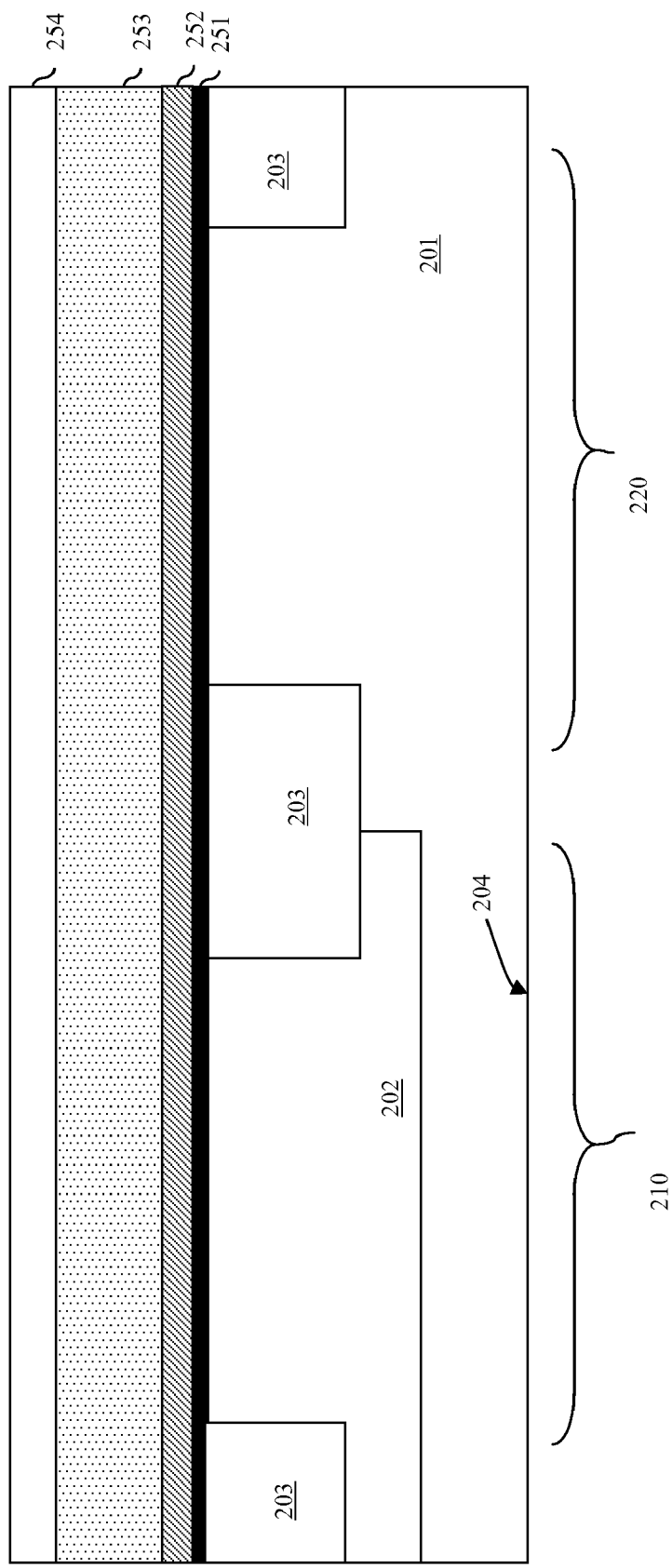
FIG. 3 is a cross-section diagram illustrating a partially-completed CMOS device formed according to the method of FIG. 1.
Figure 4:
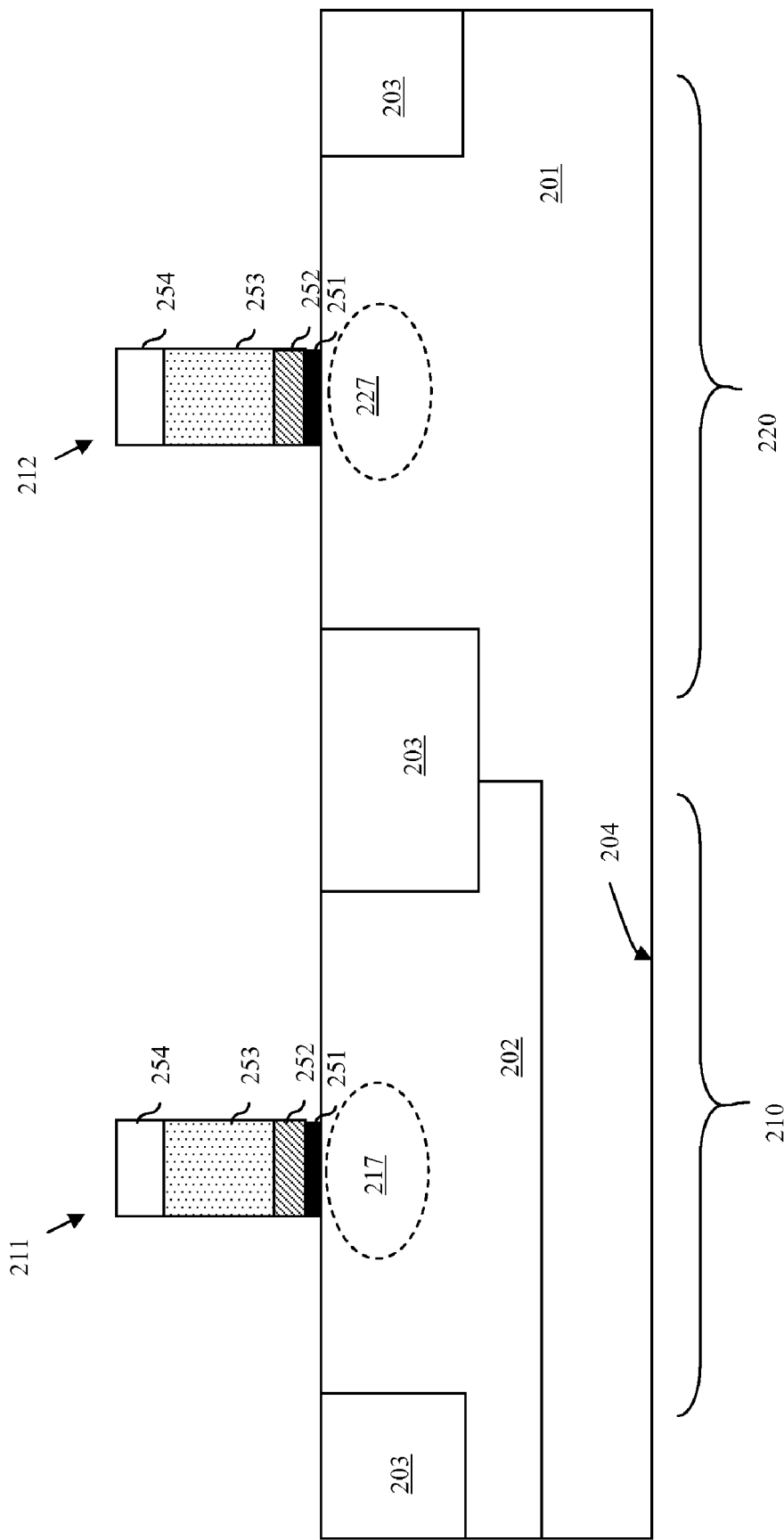
FIG. 4 is a cross-section diagram illustrating a partially-completed CMOS device formed according to the method of FIG. 1.

Then, gate stacks 211, 212 can be formed on the front side of the substrate 201. That is, a first gate stack 211 can be formed on the first section 210 adjacent to the NWELL 202 over an area designated for a PFET channel region and a second gate stack 212 can be formed on the second section 220 over an area designated for an NFET channel region (108, see FIGS. 3-4). These gate stacks 211, 212 can be formed at approximately the same time or separate. For example, in order to form the gate stacks at process 108, a gate dielectric layer 251 is formed on the substrate 201. This gate dielectric layer 251 can comprise a high-k dielectric layer. For example, the gate dielectric layer 251 can comprise a hafnium (Hf)-based material (e.g., $HfO_2$, HfSiO, HfSiON or HfAlO) or a nitrided silicon dioxide ($SiO_2$) (see FIG. 3). Next, an n-type metal layer 252 (e.g., a titanium nitride (TiN) layer) is formed on the gate dielectric layer 251 (see FIG. 3). Then, a polysilicon layer 253 (e.g., an n-doped polysilicon layer or, optionally, an intrinsic polysilicon layer or p-doped polysilicon layer) is formed on the n-type metal layer 252 and an oxide cap layer 254 is formed on the polysilicon layer 253 (see FIG. 3). Next, conventional lithographic patterning and etch processes are performed in order to form the gates stacks 211 and 212 above the first and second sections 210, 220, respectively, of the substrate 201 and, more specifically, above designated channel regions 217, 227 (see FIG. 4). Thus, each of the gate stacks 211, 212 initially comprises a gate dielectric layer 251 adjacent to the substrate 201, an n-type metal layer 252 adjacent to the gate dielectric layer 251, a polysilicon layer 253 adjacent to the n-type metal layer 252 and an oxide cap layer 254 adjacent to the polysilicon layer 253. For CMOS technology generations at or beyond the 65 nm node, these gate stacks 211, 212 should be formed, as described above, such that they have a relatively high aspect ratio (i.e., such that the width-to-height ratio of the gate stacks is one to at least five).

Figure 5:
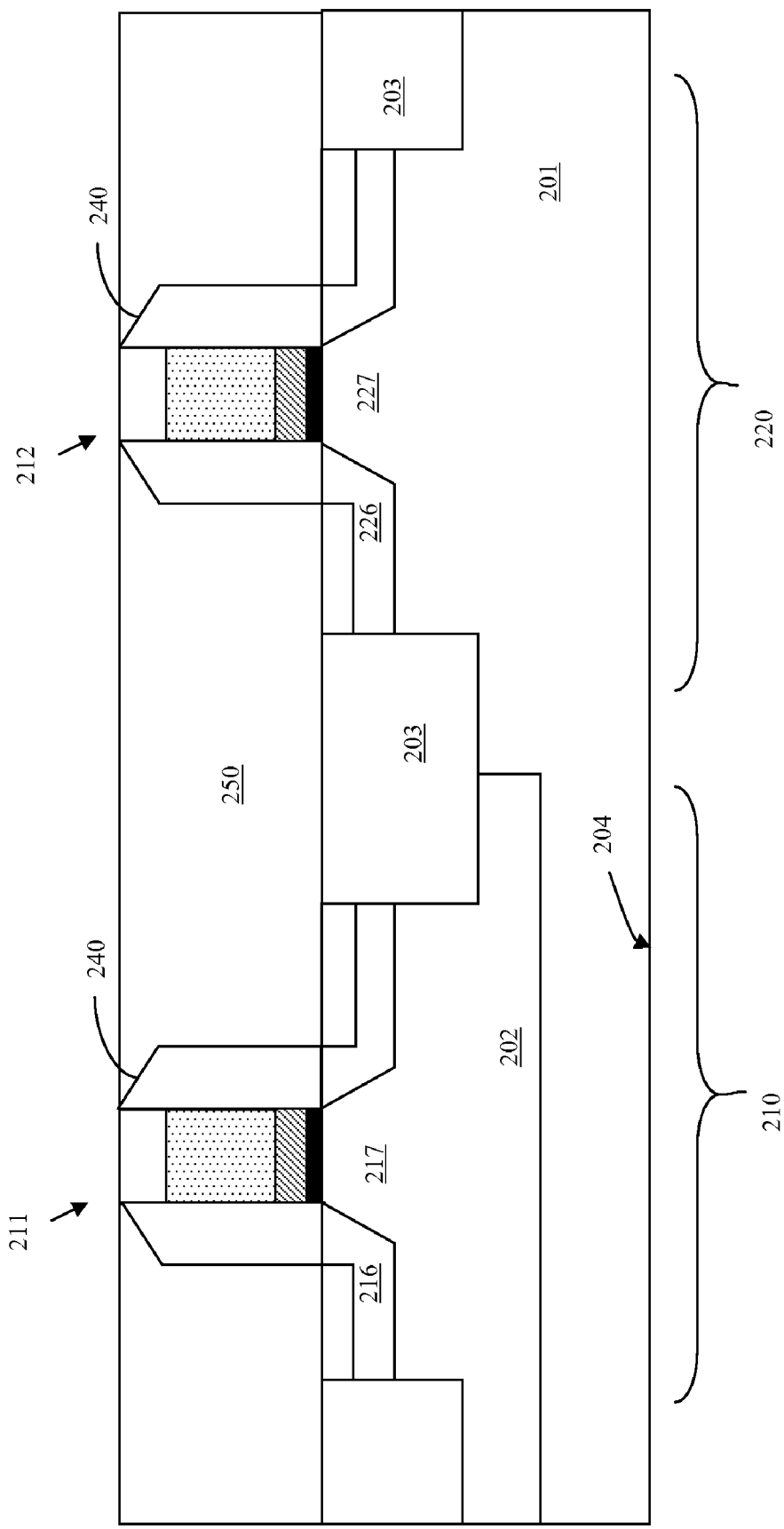
FIG. 5 is a cross-section diagram illustrating a partially-completed CMOS device formed according to the method of FIG. 1.

After the gate stacks 211, 212 are formed, conventional FET processing techniques can be performed so as to form a PFET structure in the NWELL 202 of the first section 210 of the substrate 201 and an NFET structure in the second section 220 of the substrate 201 (110, see FIG. 5). For example, this conventional FET processing can include, but is not limited to, PFET and NFET halo implantation, PFET and NFET source/drain extension implantation, gate stack sidewall spacer 240 formation, PFET and NFET source/drain region 216, 226 implantation, high temperature implant activation anneal, silicide formation, blanket dielectric layer 250 deposition and planarization, etc.). Specifically, using conventional sidewall spacer formation techniques, sidewall spacers 240 (e.g., nitride sidewall spacers) can be formed on the substrate 201 adjacent to the opposing sidewalls of each of the gate stacks 211, 212 such that they extend vertically from the bottom surface of the gate dielectric layer 251 to the top surface of the oxide layer 254.

Figure 6:
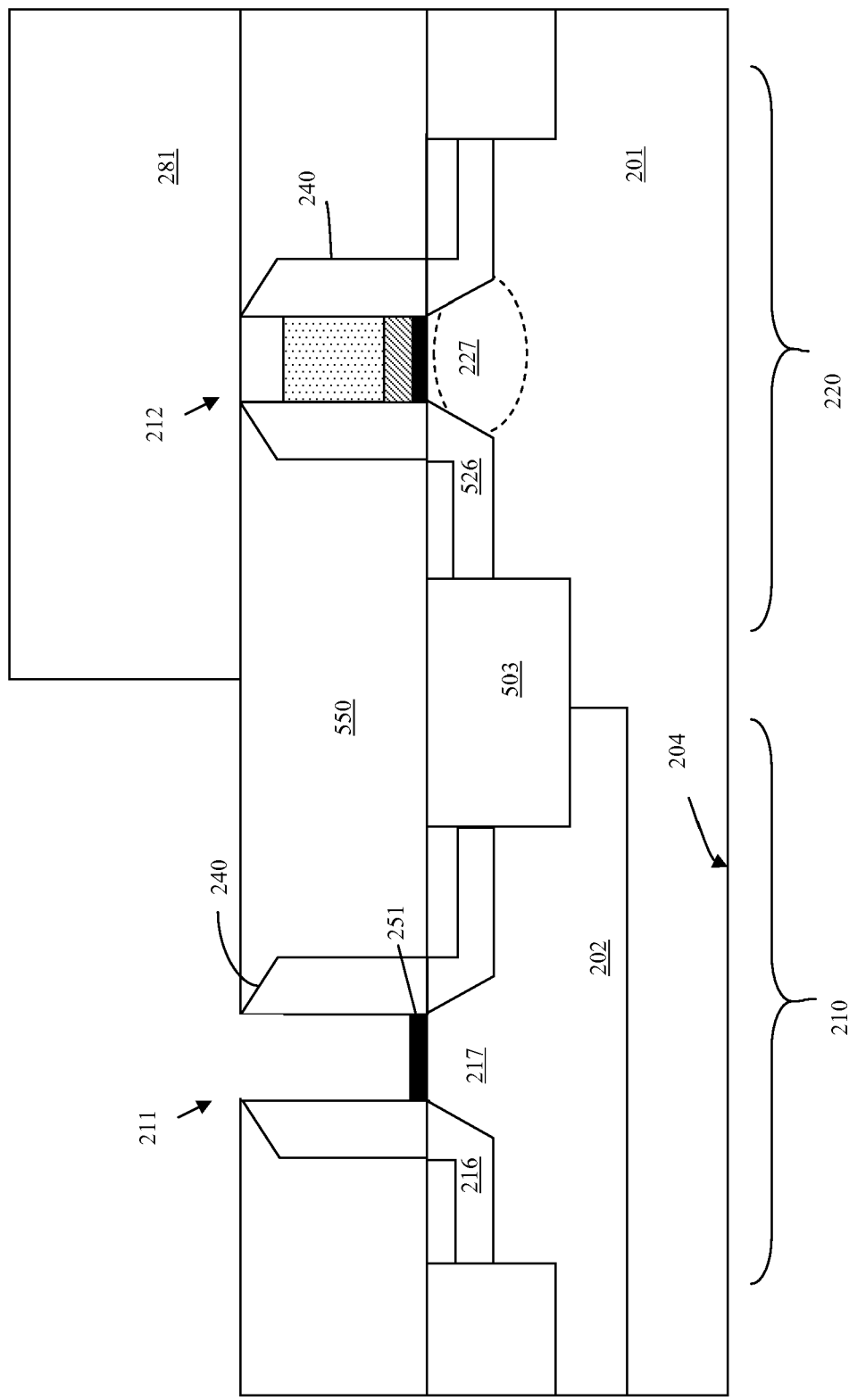
FIG. 6 is a cross-section diagram illustrating a partially-completed CMOS device formed according to the method of FIG. 1.

Once conventional FET processing is completed and, more particularly, once all high temperature processing (i.e., all processing over approximately 600° C.), such as high temperature implant activation anneals, are completed, then the polysilicon layer 253 and the n-type metal layer 252 are removed from above the gate dielectric layer 251 of the first gate stack 211, but not from above the gate dielectric layer 251 of the second gate stack 212 (112). Specifically, the second gate stack 212 can be masked (e.g., by a patterned photoresist layer 281) and etch processes (e.g. by wet or dry etch) can be performed in order to remove the oxide cap layer 254, the polysilicon layer 253 and the n-type metal layer 252 from between the sidewall spacers 240 of the first gate stack 211 (see FIG. 6).

Figure 7:
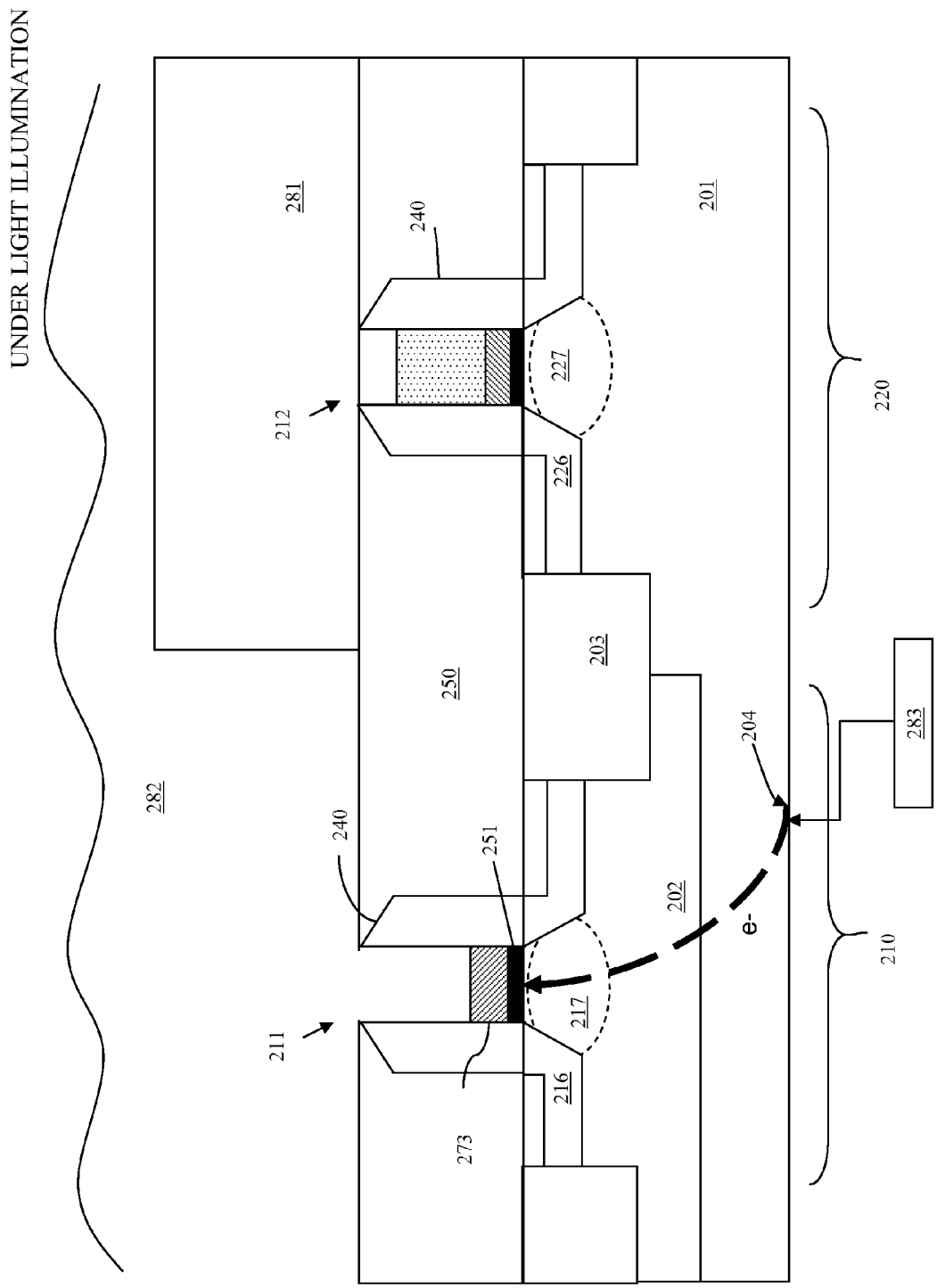
FIG. 7 is a cross-section diagram illustrating a partially-completed CMOS device formed according to the method of FIG. 1.

Then, a p-type metal gate conductor layer 273 can be electroplated onto the gate dielectric layer 251 of the first gate stack 211 (114, see FIG. 7). That is, while the second gate stack 212 is masked (e.g. by the photoresist layer 281), the structure is placed in an electroplating bath with an electroplating solution 282 and an anode (i.e., a source for a p-type metal, such as rhenium (Re), platinum (Pt) or ruthenium (Ru), or for a conducting p-type metal oxide, such as $RuO_2$ or $Re_2O_3$). However, unlike conventional electroplating processes that require the use of a seed layer, the electroplating process 114 of this embodiment applies a current from a power source 283 to the back side 204 of the substrate 201, thereby providing the required flow of electrons through the substrate 201 to the first gate stack 211 (i.e., through the gate dielectric layer 251 to allow plating on the gate dielectric layer 251). It should be noted that this electroplating process should be performed under illumination and in a positively biased electroplating solution 282 so as to ensure that the electrons will flow from the power source 283 through the back side 204 of the substrate 201 to the first gate stack 211 and, more particularly, to ensure that the electrons will flow between the p-type substrate 201 and the NWELL 202 to the first gate stack 211. Such a flow of electrons will cause p-type metal ions in the electroplating solution 282 to lose their charge and plate onto the dielectric layer 251 in the first gate stack 211. Since the p-type metal gate conductor layer 273 is plated from the bottom of the high aspect ratio gate stack opening upward, it is plated without voids or seams. Furthermore, since the p-type metal gate conductor layer 273 is plated without a seed layer, it is in direct contact with the gate dielectric layer 251 and the sidewall spacers 240. It should be noted that the required work function for the p-type metal gate conductor layer 273 can be achieved with a thickness of only a few tens of angstroms. Thus, the thickness of the p-type metal gate conductor layer 273 can be controlled during the electroplating process so that it is, for example, between approximately $1/10^{th}$ to approximately $8/10$ths the overall height of the first gate stack 211.

Once the p-type metal gate conductor layer 273 is plated onto the dielectric layer 251 in the first gate stack 211, the photoresist layer 281 and the oxide cap layer 254 of the second gate stack 212 can be removed (e.g., by wet or dry etch) (116). Finally, a wiring metal layer 255 (e.g., an aluminum (Al) or copper (Cu) layer) can be formed (e.g., deposited by chemical vapor deposition (CVD)) on the exposed p-type metal layer 273 of the first gate stack 211 and on the exposed polysilicon layer 253 in the second gate stack 212, thereby filling a space (e.g., any remaining space) between the sidewall spacers 240 of each of the gate stacks 211, 212 (118, see FIG. 8). After formation the wiring metal layer 255 is planarized by CMP to remove the metal from the top surface of the dielectric layer 250.

Figure 9:
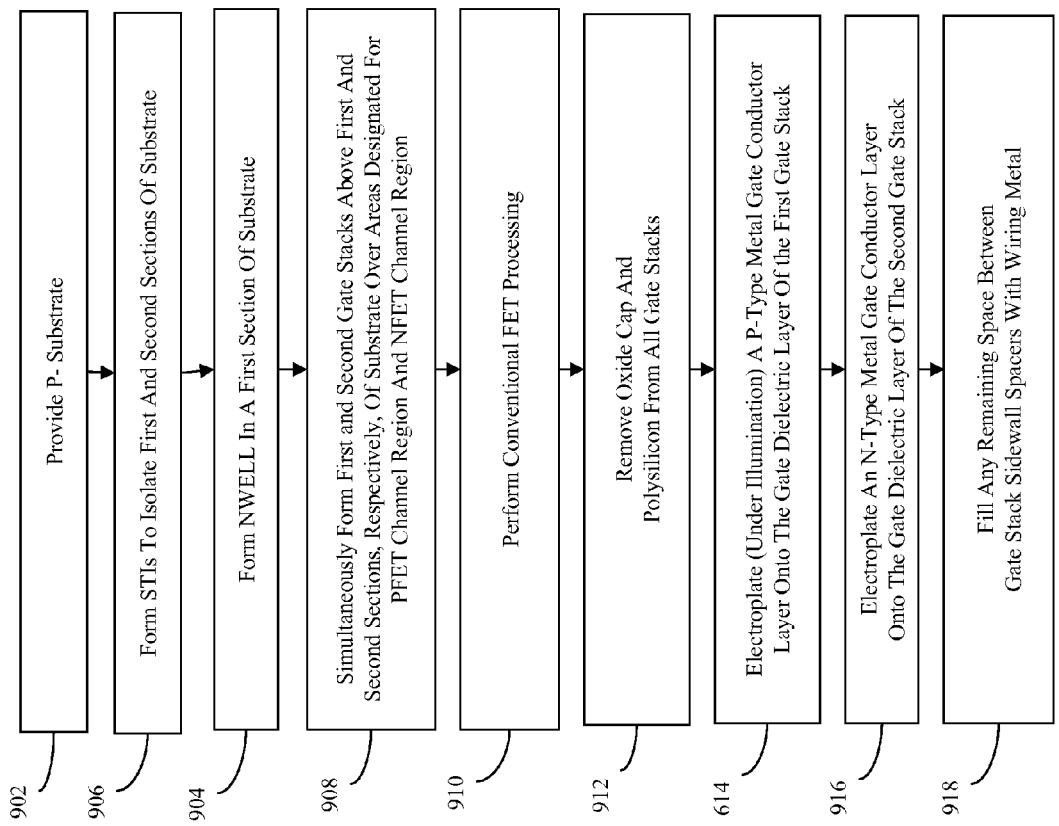
FIG. 9 is a flow diagram illustrating an embodiment of a method of forming another CMOS device 300 of FIG. 17.
Figure 10:
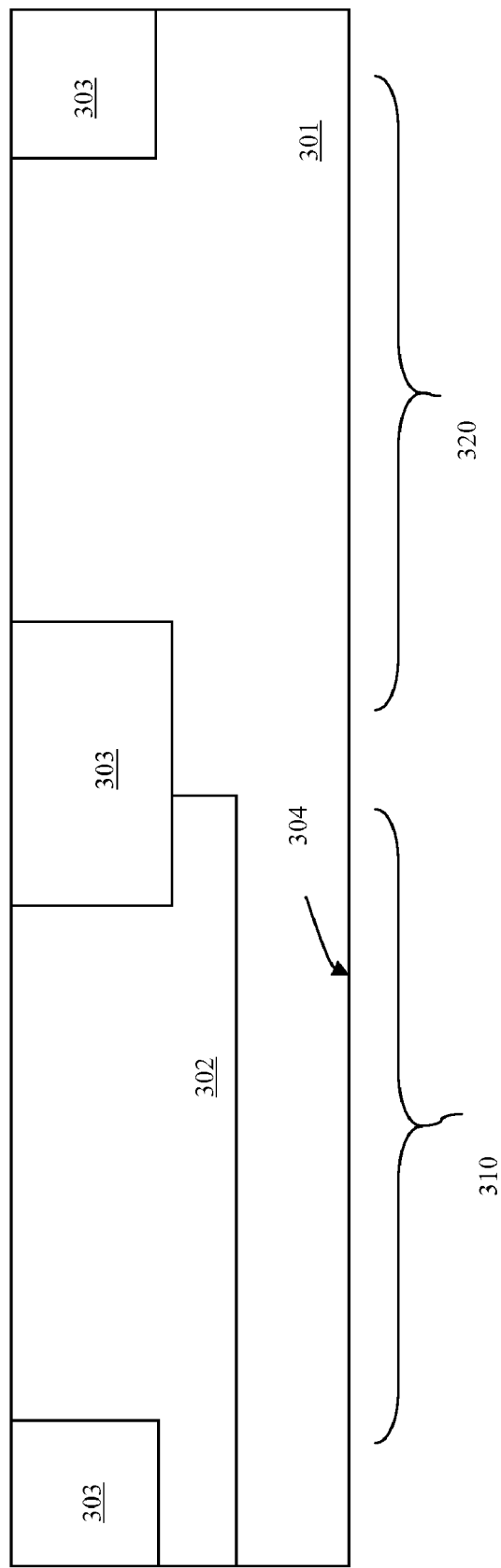
FIG. 10 is a cross-section diagram illustrating a partially-completed CMOS device formed according to the method of FIG. 9.
Figure 17:
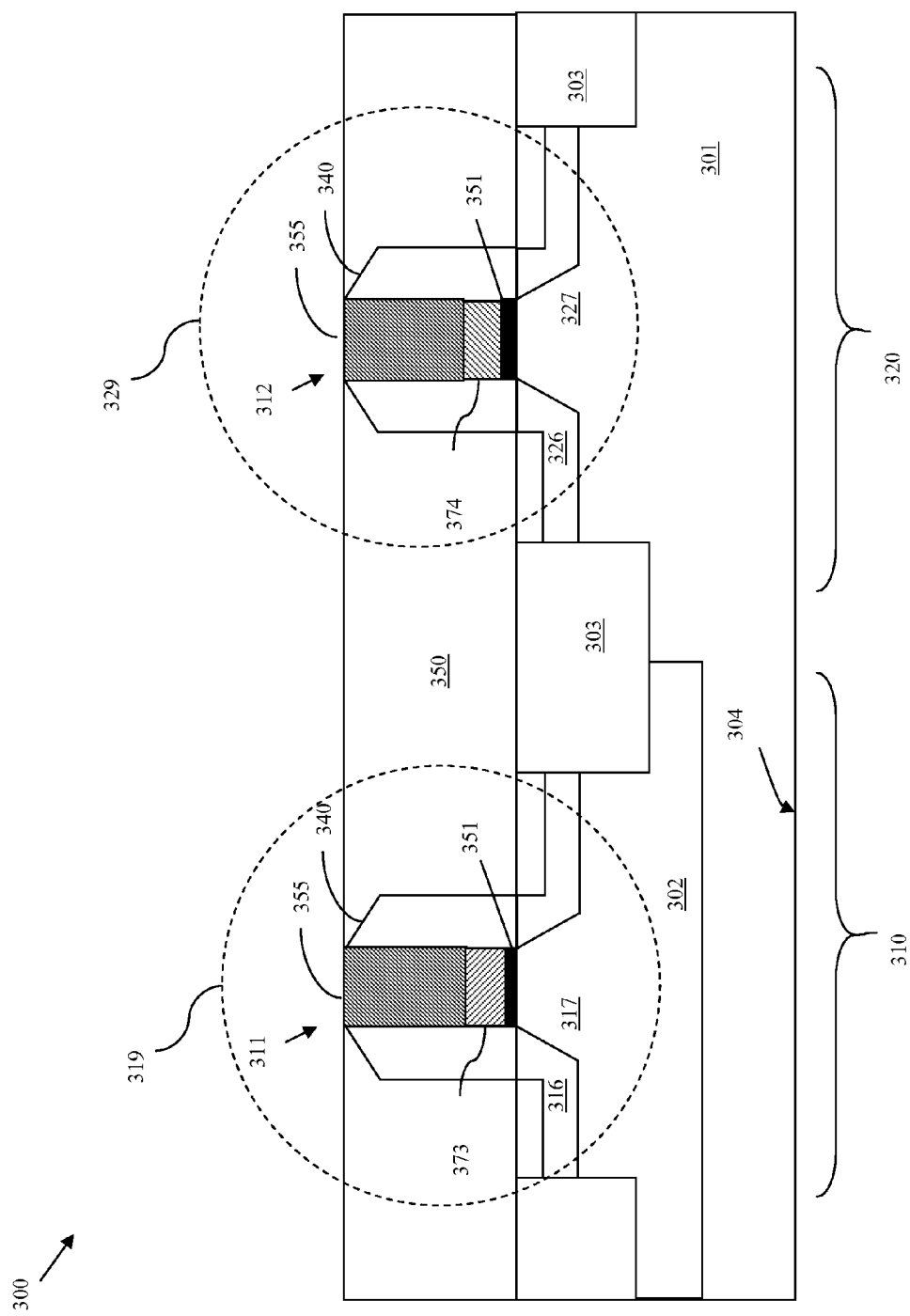
FIG. 17 is a cross-section diagram illustrating a CMOS device 300 formed according to the method of FIG. 9.

FIG. 9 is a flow diagram illustrating an embodiment of a method for forming a CMOS device 300 illustrated in FIG. 17. As with the previously described embodiment, this embodiment comprises providing a p-type substrate 301, having a first section 310 for PFET formation and a second section 320 for NFET formation positioned laterally adjacent to the first section 310 (902, see FIG. 10). Shallow trench isolation (STI) regions 303 can be formed, using conventional STI processing techniques, in order to isolate the first section 310 from the second section 320 of the substrate 301 (904, see FIG. 10). Next, an n-type well region 302 (NWELL) can be formed in the first section 310 (904, see FIG. 10). That is, conventional, masked, deep-implantation techniques can be used to implant an n-type dopant (e.g., arsenic (As), antimony (Sb) or phosphorous (P)) into the substrate 301 in the first section 310.

Figure 11:
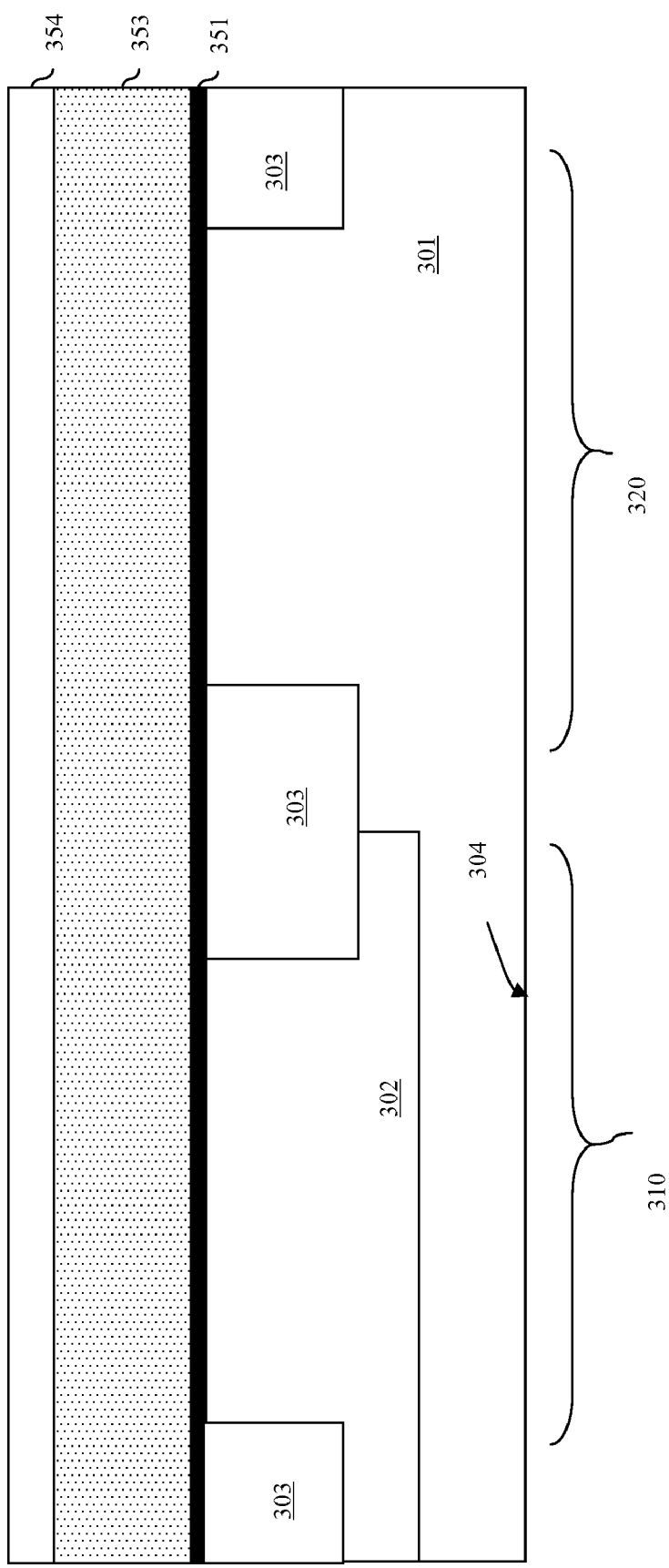
FIG. 11 is a cross-section diagram illustrating a partially-completed CMOS device formed according to the method of FIG. 9.
Figure 12:
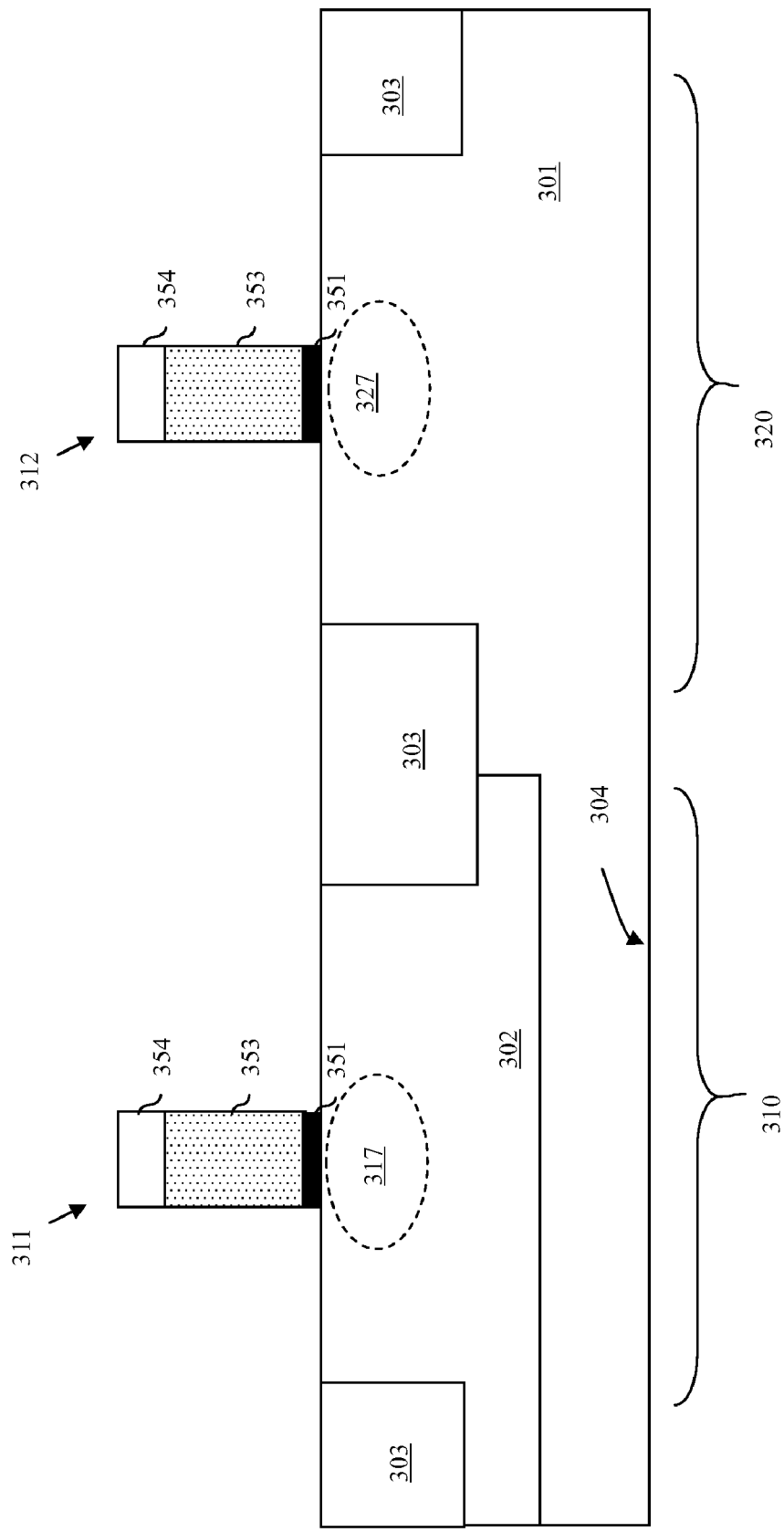
FIG. 12 is a cross-section diagram illustrating a partially-completed CMOS device formed according to the method of FIG. 9.

Then, gate stacks 311, 312 can be formed on the front side of the substrate 301. That is, a first gate stack 311 can be formed on the first section 310 adjacent to the NWELL 302 over an area designated for a PFET channel region and a second gate stack 312 can be formed on the second section 320 over an area designated for an NFET channel region (908, see FIGS. 11-12). These gate stacks 311, 312 can be formed at approximately the same time or separately. For example, in order to form the gate stacks 311, 312 at process 908, a gate dielectric layer 351 is formed on the substrate 301. This gate dielectric layer 351 can comprise a high-k dielectric layer. For example, the gate dielectric layer 351 can comprise a hafnium (Hf)-based material (e.g., $HfO_2$, HfSiO, HfSiON or HfAlO) or a nitrided silicon dioxide ($SiO_2$) (see FIG. 11). Then, a polysilicon layer 353 (e.g., an n-doped polysilicon layer or, optionally, an intrinsic polysilicon layer or p-doped polysilicon layer) is formed on the gate dielectric layer 551 and an oxide cap layer 554 is formed on the polysilicon layer 553 (see FIG. 11). Next, conventional lithographic patterning and etch processes are performed in order to form the gates stacks 311 and 312 above the first and second sections 310, 320, respectively, of the substrate 301 and, more specifically, above designated channel regions 317, 327 (see FIG. 12). Thus, each of the gate stacks 311, 312 initially comprises a gate dielectric layer 351 adjacent to the substrate 301, a polysilicon layer 353 adjacent to the gate dielectric layer 351 and an oxide cap layer 354 adjacent to the polysilicon layer 353. For CMOS technology generations at or beyond the 65 nm node, these gate stacks 311, 312 should be formed, as described above, such that they have a relatively high aspect ratio (i.e., such that the width-to-height ratio of the gate stacks is one to at least five).

Figure 13:
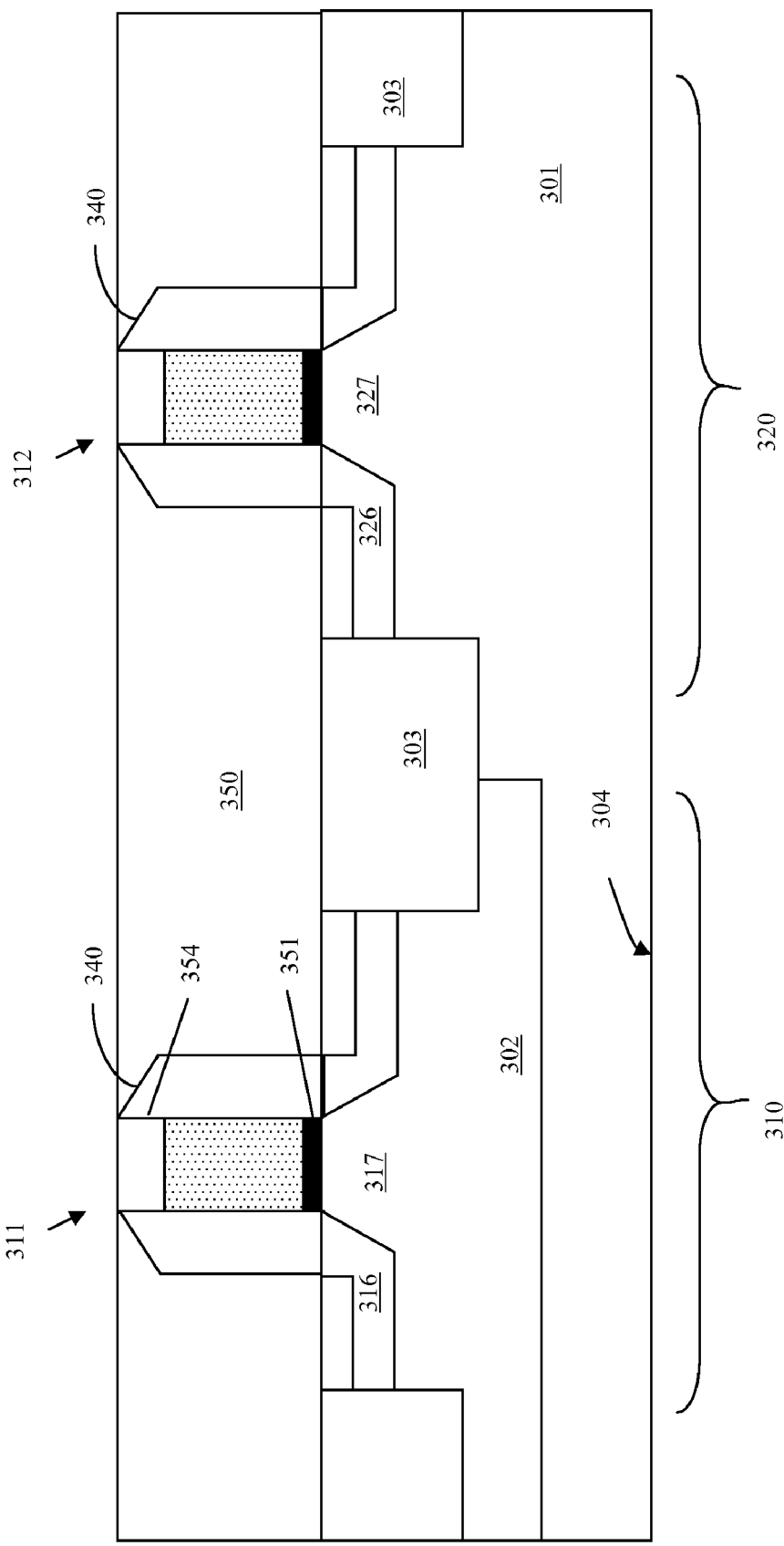
FIG. 13 is a cross-section diagram illustrating a partially-completed CMOS device formed according to the method of FIG. 9.

After the gate stacks 311, 312 are formed, conventional FET processing techniques can be performed so as to form a PFET structure in the NWELL 302 of the first section 310 of the substrate 301 and an NFET structure in the second section 320 of the substrate 301 (910, see FIG. 13). For example, this conventional FET processing can include, but is not limited to, PFET and NFET halo implantation, PFET and NFET source/drain extension implantation, gate stack sidewall spacer 340 formation, PFET and NFET source/drain region 316, 326 implantation, high temperature implant activation anneal, silicide formation, blanket dielectric layer 350 deposition and planarization, etc.). Specifically, using conventional sidewall spacer formation techniques, sidewall spacers 340 (e.g., nitride sidewall spacers) can be formed on the substrate 301 adjacent to the opposing sidewalls of each of the gate stacks 311, 312 such that they extend vertically from the bottom surface of the gate dielectric layer 351 to the top surface of the oxide layer 354.

Figure 14:
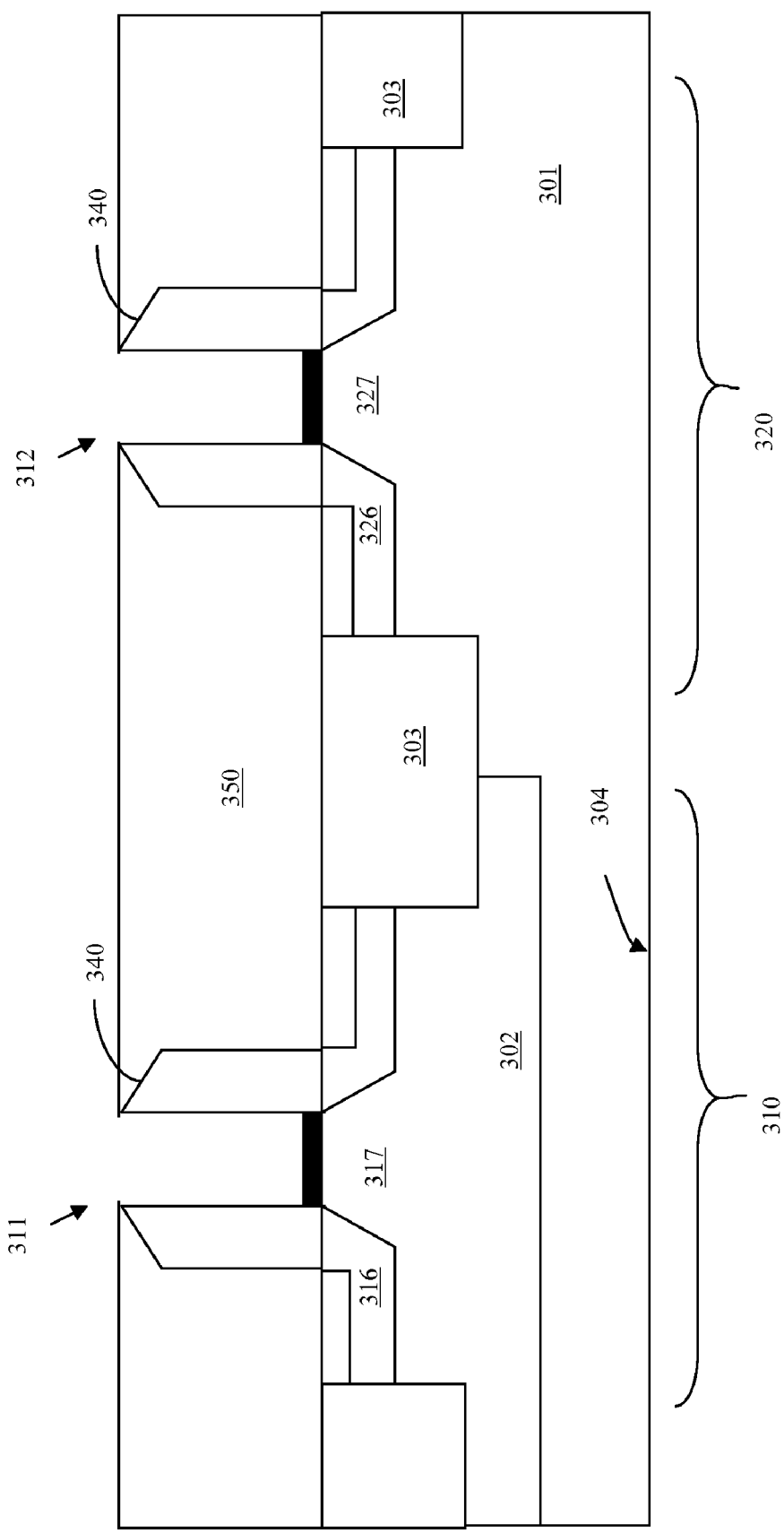
FIG. 14 is a cross-section diagram illustrating a partially-completed CMOS device formed according to the method of FIG. 9.

Once conventional FET processing is completed and, more particularly, once all high temperature processing (i.e., all processing over approximately 600° C.), such as high temperature implant activation anneals, are completed, then the polysilicon layer 353 is removed from above the gate dielectric layer 351 of each of the gate stacks 311, 312 (912, see FIG. 14). Specifically, etch processes (e.g. wet or dry etch processes) can be performed in order to remove the oxide cap layer 354 and then, the polysilicon layer 353 from between the sidewall spacers 340 of the gate stack 311 and 312.

Figure 15:
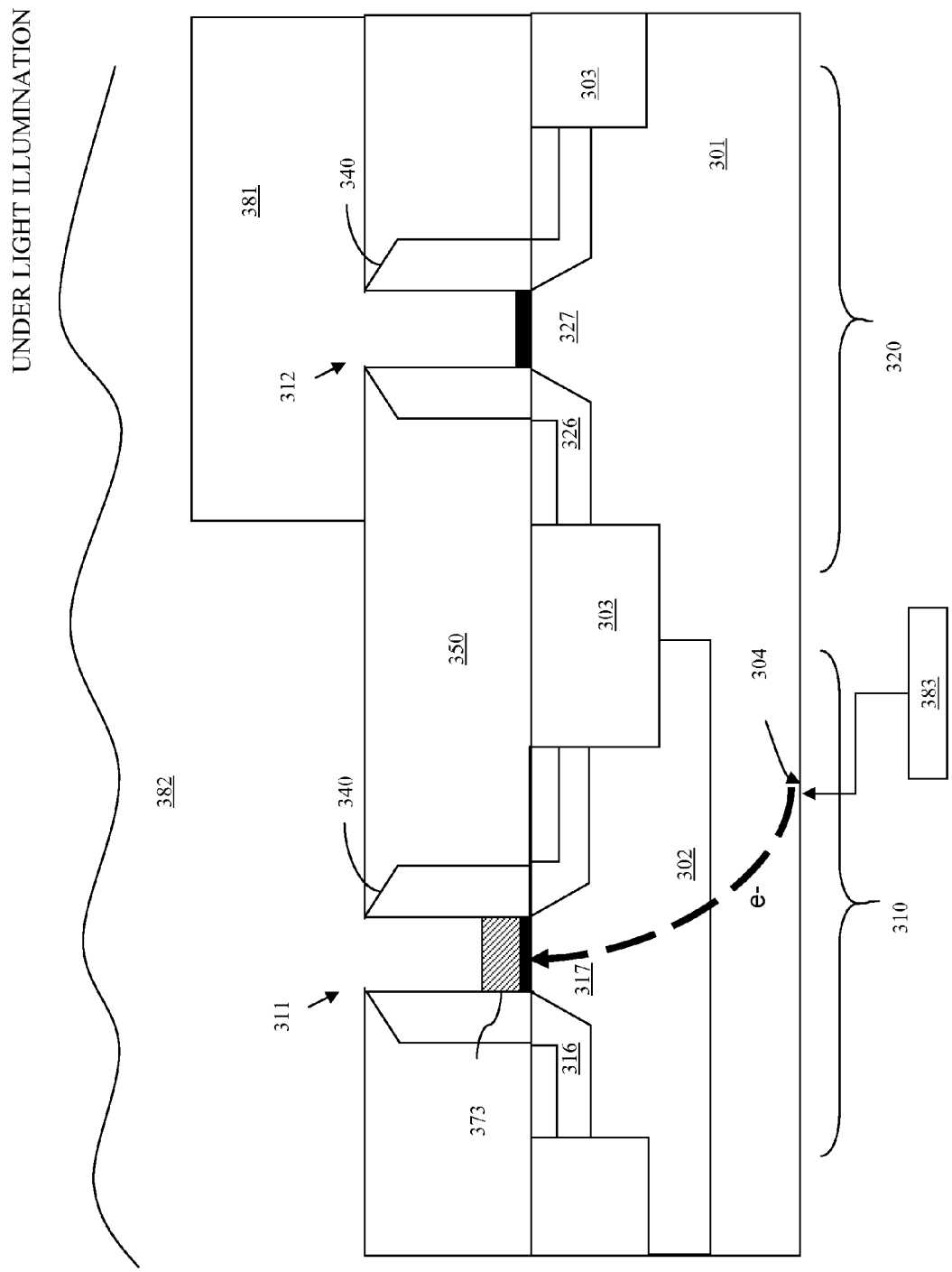
FIG. 15 is a cross-section diagram illustrating a partially-completed CMOS device formed according to the method of FIG. 9.

Then, a p-type metal gate conductor layer 373 can be electroplated onto the gate dielectric layer 351 of the first gate stack 311 (914, see FIG. 15). Specifically, the second gate stack 312 can be masked (e.g., by a patterned photoresist layer 381). Then, the structure is placed in an electroplating bath with an electroplating solution 382 and an anode (i.e., a source for a p-type metal, such as rhenium (Re), platinum (Pt) or ruthenium (Ru), or for a conducting p-type metal oxide, such as $RuO_2$ or $Re_2O_3$). However, unlike conventional electroplating processes that require the use of a seed layer, the electroplating process 914 of this embodiment applies a current from a power source 383 to the back side 304 of the substrate 301, thereby providing the required flow of electrons through the substrate 301 to the first gate stack 311 (i.e., through the gate dielectric layer 351 to allow plating on the gate dielectric layer 351 of the first gate stack 311). Thus, during the electroplating process, current and, thereby electrons will flow directly through the substrate 301 to the first gate stack 311 and no seed layer is required. It should be noted that this electroplating process should be performed under illumination and in a positively biased electroplating solution 382 so as to ensure that the electrons will flow from the power source 383 through the back side 304 of the substrate 301 to the first gate stack 311 and, more particularly, to ensure that the electrons will flow between the p-type substrate 301 and the NWELL 302 to the first gate stack 311. Such a flow of electrons will cause p-type metal ions in the electroplating solution 382 to lose their charge and plate onto the dielectric layer 351 in the first gate stack 311. The photoresist layer 381 protects the dielectric layer 351 in the second gate stack 312. Since the p-type metal gate conductor layer 373 is plated from the bottom of the high aspect ratio gate stack opening upward, it is plated without voids or seams. Furthermore, since the p-type metal gate conductor layer 373 is plated without a seed layer, it is in direct contact with the gate dielectric layer 351 and the sidewall spacers 340. It should be noted that the required work function for the p-type metal gate conductor layer 373 can be achieved with a thickness of only a few tens of angstroms. Thus, the thickness of the p-type metal gate conductor layer 373 can be selectively controlled during the electroplating process so that it is, for example, between approximately $1/10^{th}$ to approximately $8/10ths$ the overall height of the first gate stack 311.

Figure 16:
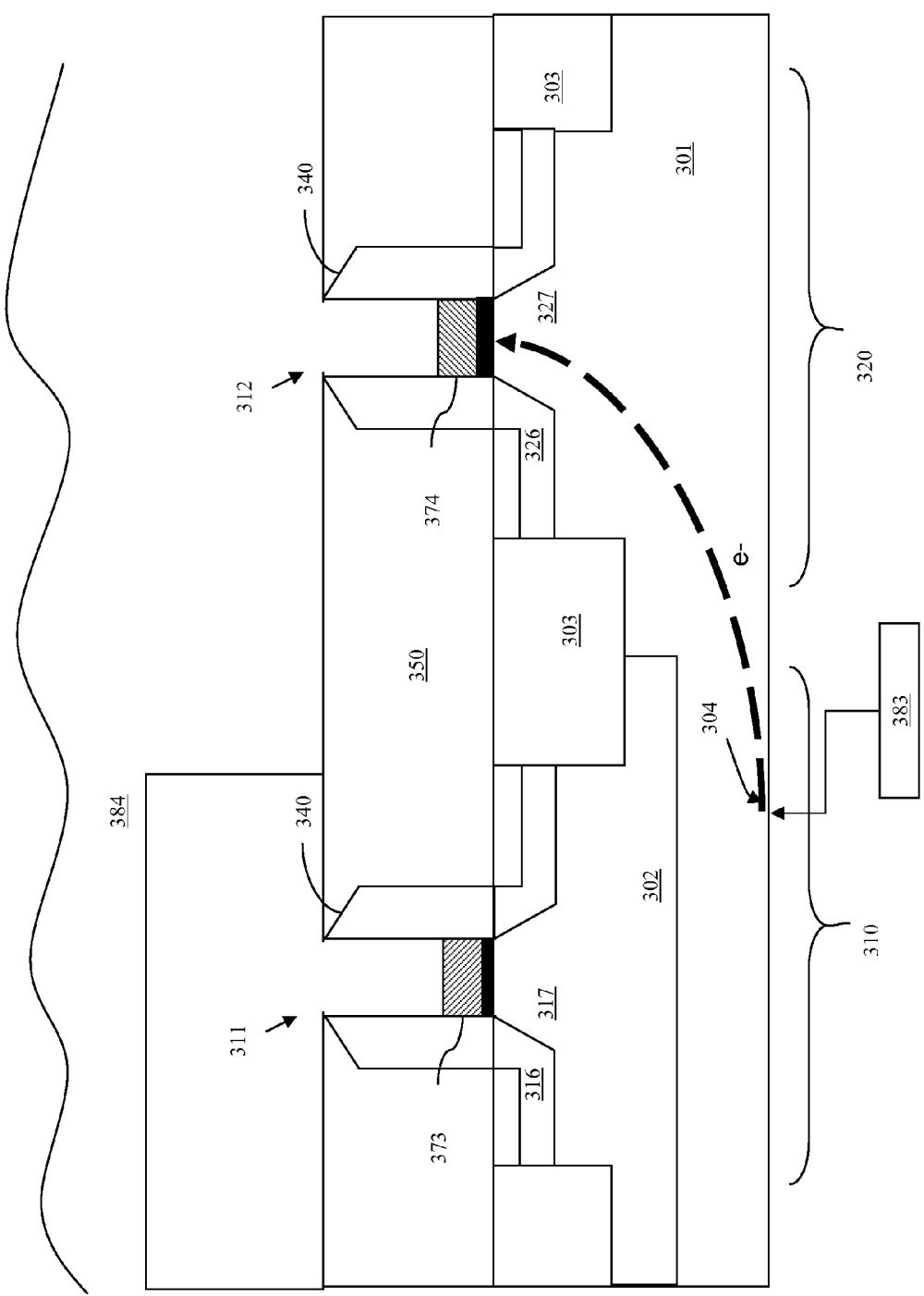
FIG. 16 is a cross-section diagram illustrating a partially-completed CMOS device formed according to the method of FIG. 9.

Once the p-type metal gate conductor layer 373 is plated onto the dielectric layer 351 in the first gate stack 311, an n-type metal gate conductor layer 374 can be electroplated onto the gate dielectric layer 351 of the second gate stack 312 (916, see FIG. 16). Specifically, after the p-type metal electroplating, the photoresist layer 381 from above the second gate stack 312 is removed and another patterned photoresist layer 384 can be formed to mask the first gate stack 311. Then, the structure is placed in an electroplating bath with an electroplating solution 384 and an anode (i.e., a source for an n-type metal, such as, hafnium (Hf), zirconium (Zr), titanium (Ti), tantalum (Ta) or aluminum (Al)). Again, unlike conventional electroplating processes that require the use of a seed layer, the electroplating process 916 applies a current from the power source 383 to the back side 304 of the substrate 301, thereby providing the required flow of electrons through the substrate 301 to the second gate stack 312 (i.e., through the gate dielectric layer 351 to allow plating on the gate dielectric layer 351 of the second gate stack 312). Since the first gate stack 311 is masked, this process can be performed under illumination and in a positively biased electroplating solution to enhance electron flow to the second gate stack 312 without risking plating on the first gate stack 311. As with the p-type metal layer 373 of the first gate stack 311, the required work function for the n-type metal gate conductor layer 374 can be achieved with a thickness of only a few tens of angstroms. Thus, the thickness of the n-type metal gate conductor layer 374 can be selectively controlled during the electroplating process so that it is, for example, between approximately $1/10^{th}$ to approximately $8/10ths$ the overall height of the second gate stack 312.

Finally, a wiring metal layer 355 (e.g., an aluminum (Al) or copper (Cu) layer) can be formed (e.g., deposited by chemical vapor deposition (CVD)) onto the exposed p-type metal layer 373 of the first gate stack 311 and onto the exposed n-type metal layer 374 in the second gate stack 312, thereby filling a space (e.g., any remaining space) between the sidewall spacers 340 of each of the gate stacks 311, 312 (918, see FIG. 17). After the wiring metal layer 355 is formed, it is planarized by CMP to remove the metal from the top surface of the dielectric layer 350.

Consequently, the method embodiments of FIGS. 1 and 9 result in similar CMOS structures 200 of FIG. 8 and 300 of FIG. 17. Specifically, the CMOS structures 200, 300 each comprise a p-type substrate 201, 301. This p-substrate 201, 301 has a first section 210, 310 on which a p-type field effect transistor (PFET) 219, 319 is formed and a second section 220, 320 on which an n-type field effect transistor (NFET) 229, 329 is formed. The second section 220, 320 is positioned laterally adjacent to the first section 210, 310 and these sections are separated (i.e., isolated from each other) by shallow trench isolation (STI) structures 203, 303.

The PFET 219, 319 comprises an n-type well region (NWELL) 202, 302 located within the first section 210, 310 of the substrate 201, 310. This NWELL 202, 302 is appropriately doped with an n-type dopant (e.g., arsenic (As), antimony (Sb) or phosphorous (P)). The PFET 219, 319 further comprises typical PFET components, including but not limited to, source/drain regions 216, 316 (i.e., p-type diffusion regions) located within the NWELL 202, 302 at the top surface of the substrate 201, 301 and a channel region 217, 317 positioned between the source/drain regions 216, 316. The PFET 219, 319 also comprises a PFET gate stack 211, 311. This PFET gate stack 211, 311 is positioned on the top surface (i.e., the front side) of the substrate 201, 301 and, more particularly, on channel region 217, 317 between the source/drain regions 216, 316. Sidewall spacers 240, 340 (e.g., nitride sidewall spacers) are positioned on opposing sidewalls of the gate stack 211, 311. A blanket dielectric material 250, 350 (e.g., an oxynitride material) is positioned above the substrate 201 and STIs 203, 303 adjacent to the sidewall spacers 240, 340. The PFET gate stack 211, 311 has a relatively high aspect ratio (i.e., the width-to-height ratio of the gate stack is one to at least five) and further comprises a void-free and seam-free, p-type gate conductor metal layer 273, 373.

Specifically, the PFET gate stack 211, 311 comprises a gate dielectric layer 251, 351 (e.g., a high-k dielectric layer, such as a hafnium (Hf)-based material (e.g., $HfO_2$, HfSiO, HfSiON or HfAlO) or a nitrided silicon dioxide ($SiO_2$)) adjacent to the NWELL channel region 217, 317. A p-type metal gate conductor layer 273, 373 is positioned on the gate dielectric layer 251, 351. This p-type metal gate conductor layer 273, 373 comprises a p-type metal (e.g., rhenium (Re), platinum (Pt), ruthenium (Ru), etc.) or a conducting p-type metal oxide (e.g., $RuO_2$, $Re_2O_3$, etc.). As discussed in detail above, this p-type metal gate conductor layer 273, 373 is formed using an electroplating process that passes a current through the back side 204, 304 of the substrate 201, 301, thereby providing the required electron flow through the substrate 201, 301 to the PFET gate stack 211, 311 and eliminating the need for a seed layer (i.e., the PFET gate stack 211, 311 is devoid of any seed layers). This allows the electroplating process to fill a high aspect ratio PFET gate stack opening with the p-type gate conductor metal layer 273, 373 from the bottom upward without voids or seams. It further ensures that the p-type metal gate conductor layer 273, 373 is in direct contact with the gate dielectric layer 251, 351 and the sidewall spacers 240, 340. The thickness of the p-type metal layer 273, 373 can be between approximately $\frac{1}{10}^{th}$ to approximately $\frac{9}{10}$ths the overall height of the PFET gate stack 211. The remaining portion of the high aspect ratio gate stack 211, 311 between the sidewall spacers 240, 340 and above the p-type metal gate conductor layer 273, 373 comprises a wiring metal layer 255 (e.g., a copper (Cu) layer or aluminum (Al) layer).

The CMOS devices 200, 300 each also comprise an NFET transistor 229, 329, which comprises typical NFET components, including but not limited to, source/drain regions 226, 326 (i.e., n-type diffusion regions) located within the second section 220, 320 of the substrate 201, 301 at the top surface and a channel region 227, 327 positioned between the source/drain regions 226, 326. The NFET 229, 329 also comprise an NFET gate stack 221, 321. This NFET gate stack 212, 312 similarly comprises a high aspect ratio stack (i.e., the width-to-height ratio of the gate stack is one to at least five). This NFET gate stack 212, 312 is positioned on the top surface (i.e., the front side) of the substrate 201, 301 and, more particularly, on channel region 227, 327 between the source/drain regions 226, 326. Sidewall spacers 240, 340 (e.g., nitride sidewall spacers) are positioned on opposing sidewalls of the gate stack 212, 312. A blanket dielectric material 250, 350 (e.g., an oxynitride material) is positioned above the substrate 201, 301 and STIs 203, 303 adjacent to the sidewall spacers 240, 340. The blanket dielectric material 250, 350 can be polished to expose the top surface of the NFET gate stack 212, 312. However, due to the different method embodiments, the compositions of the NFET gate stacks 212 of FIGS. 8 and 312 of FIG. 17 differ.

Specifically, the NFET gate stack 212 of the CMOS device 200 of FIG. 8 comprises a gate dielectric layer 251 (i.e., a second gate dielectric layer) on the second section 220 of the substrate 201 directly adjacent to the channel region 227. This gate dielectric layer 251 can comprise, for example, the same high-k dielectric material used for the gate dielectric layer in the PFET gate stack 211. The NFET gate stack 212 can further comprise an n-type metal gate conductor layer 252 (e.g., titanium nitride (TiN)) on the gate dielectric layer 251. As with the p-type metal layer 273 in the PFET gate stack 211, the required work function can be achieved with an n-type metal gate conductor layer 252 that is only a few tens of angstroms thick. The remaining portion of the high aspect ratio gate stack 212 between the sidewall spacers 240 and above the n-type metal gate conductor layer 252 can comprise an n-doped polysilicon layer 253 on the n-type metal layer 252 and wiring metal layer 255 (i.e., a second wiring metal layer) on the polysilicon layer 253. This wiring metal layer 255 can comprise the same wiring metal material as used in the PFET gate stack 211 (e.g., a copper (Cu) or aluminum (Al)).

Alternatively, the NFET gate stack 312 of the CMOS device 300 of FIG. 17 comprises a gate dielectric layer 351 (i.e., a second gate dielectric layer) on the second section 320 of the substrate 301 directly adjacent to the channel region 327. This gate dielectric layer 351 can comprise, for example, the same high-k dielectric material used for the gate dielectric layer in the PFET gate stack 311. The NFET gate stack 312 can further comprise an n-type metal gate conductor layer 374. In this case, however, the n-type metal gate conductor layer 374 comprises an electroplated, void-free and seam-free, n-type metal layer. This electroplated n-type metal layer 374 can comprise, for example, hafnium (Hf), zirconium (Zr), titanium (Ti), tantalum (Ta) or aluminum (Al). Again, the required work function can be achieved with an n-type metal gate conductor layer 374 that is only a few tens of angstroms thick. The remaining portion of the high aspect ratio gate stack 312 between the sidewall spacers 340 and above the n-type metal gate conductor layer 374 can comprise a wiring metal layer 355 (i.e., a second wiring metal layer). This wiring metal layer 355 can comprise the same wiring metal material as used in the PFET gate stack 311 (e.g., a copper (Cu) or aluminum (Al)).

Figure 18:
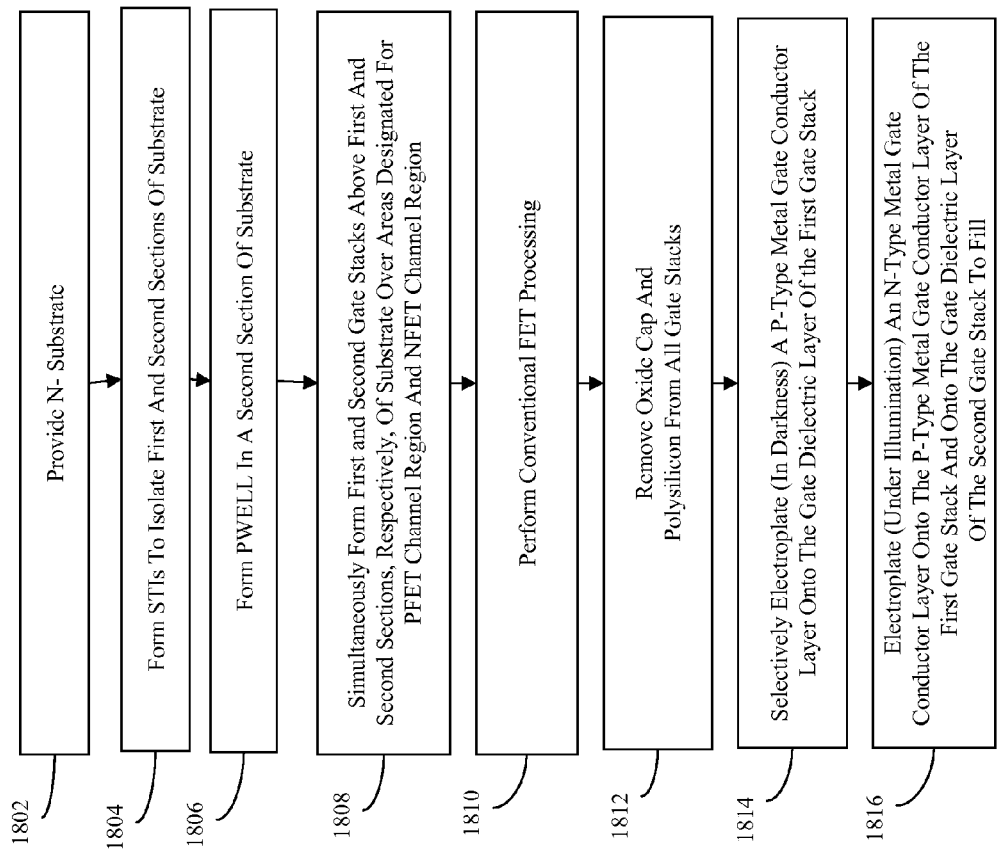
FIG. 18 is a flow diagram illustrating an embodiment of a method of forming another CMOS device 400 of FIG. 26.
Figure 19:
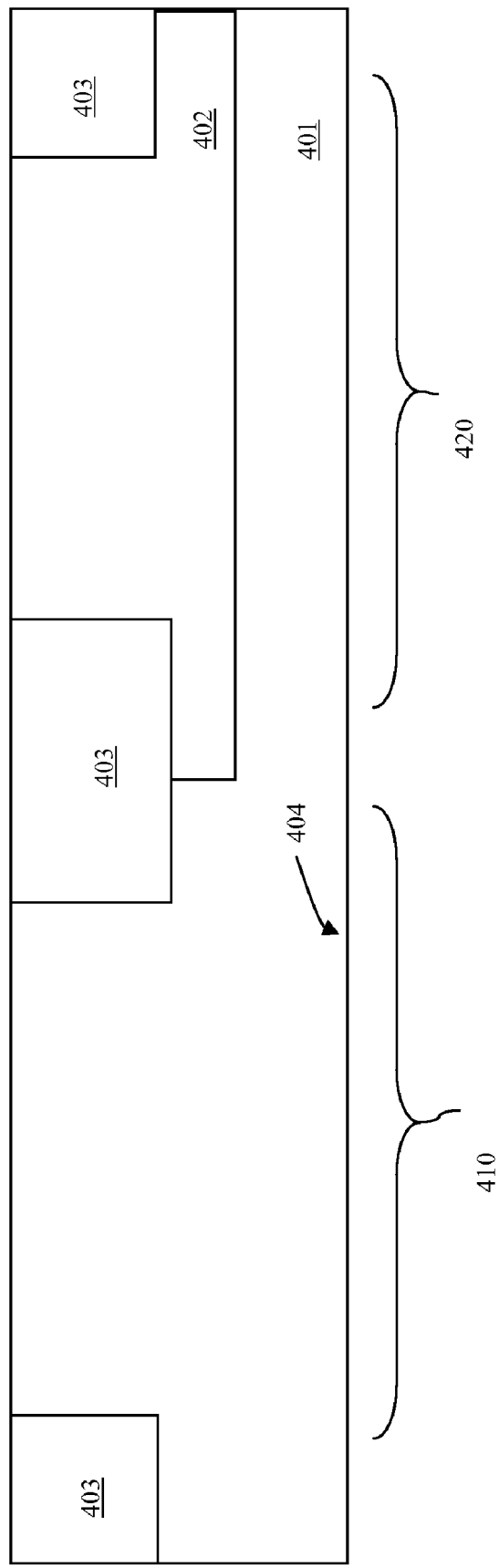
FIG. 19 is a cross-section diagram illustrating a partially-completed CMOS device formed according to the method of FIG. 18.
Figure 26:
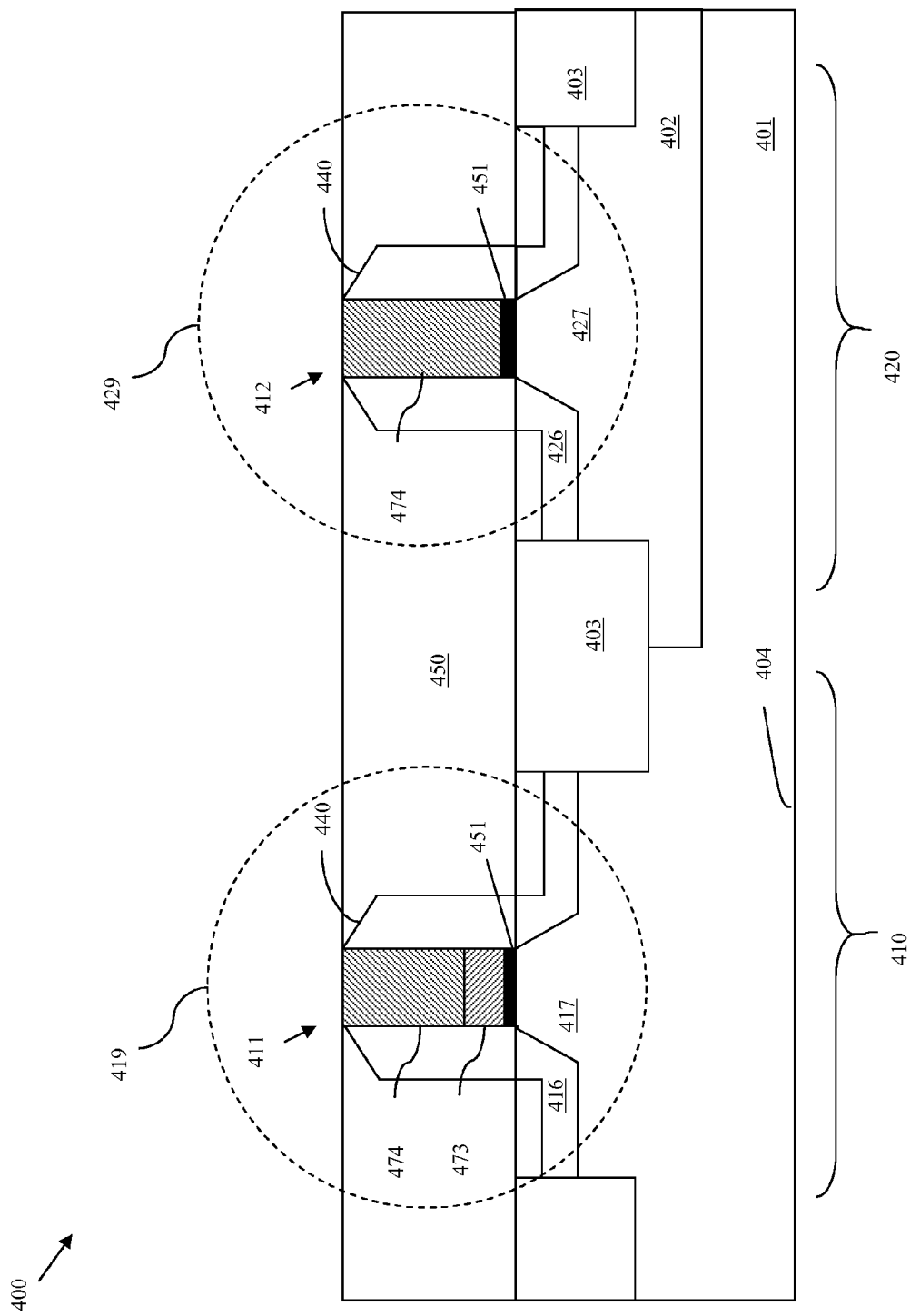
FIG. 26 is a cross-section diagram illustrating a CMOS device 400 formed according to the method of FIG. 18.

FIG. 18 is a flow diagram illustrating an embodiment of a method for forming a CMOS device 400 illustrated in FIG. 26. Unlike the previously described method embodiments, this embodiment comprises providing an n-type substrate 401, having a first section 410 for PFET formation and a second section 420 for NFET formation positioned laterally adjacent to the first section 410 (1802, see FIG. 22). Shallow trench isolation (STI) regions 403 can be formed, using conventional STI processing techniques, in order to isolate the first section 410 from the second section 420 of the substrate 401 (1804, see FIG. 19). Next, a p-type well region 402 (PWELL) can be formed in the second section 420 (1806, see FIG. 19). That is, conventional, masked, deep-implantation techniques can be used to implant a p-type dopant (e.g., boron (B)) into the substrate 401 in the first section 410.

Figure 20:
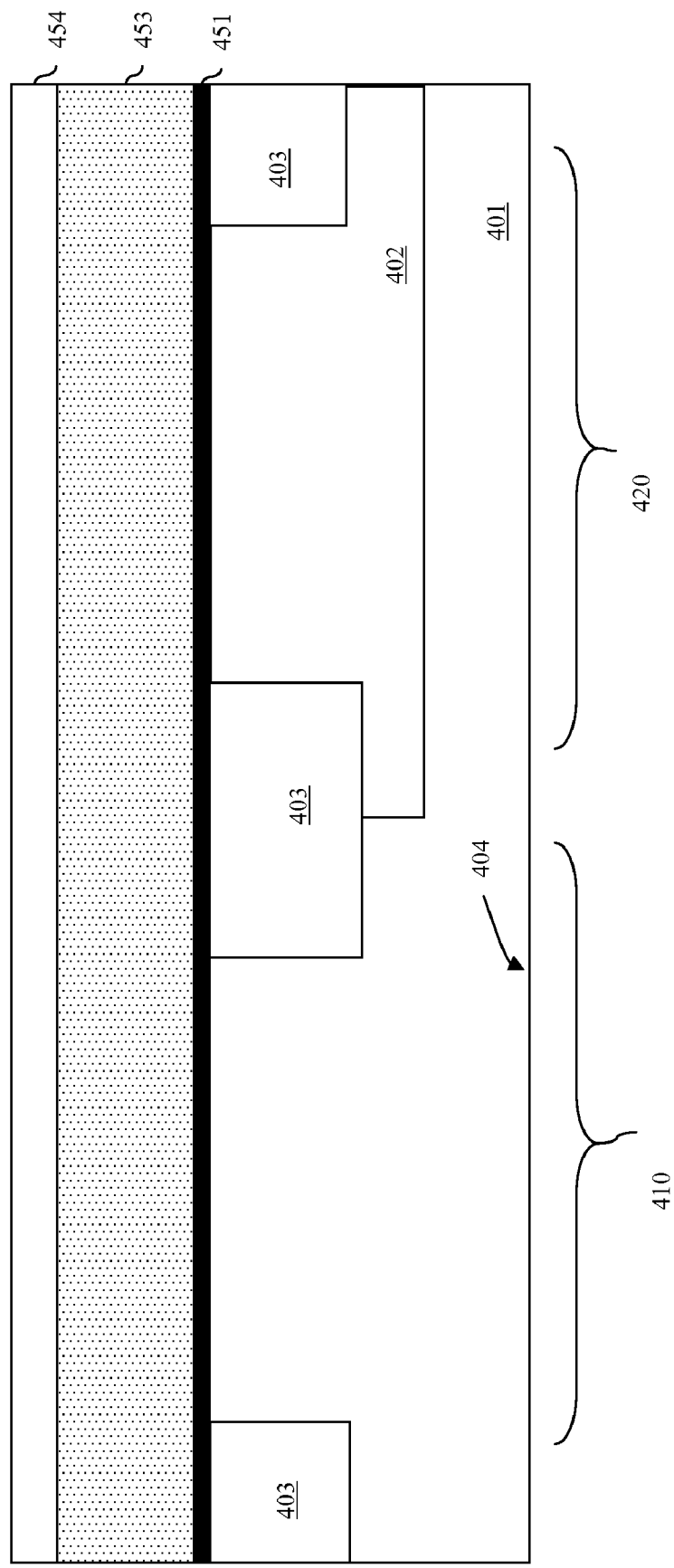
FIG. 20 is a cross-section diagram illustrating a partially-completed CMOS device formed according to the method of FIG. 18.
Figure 21:
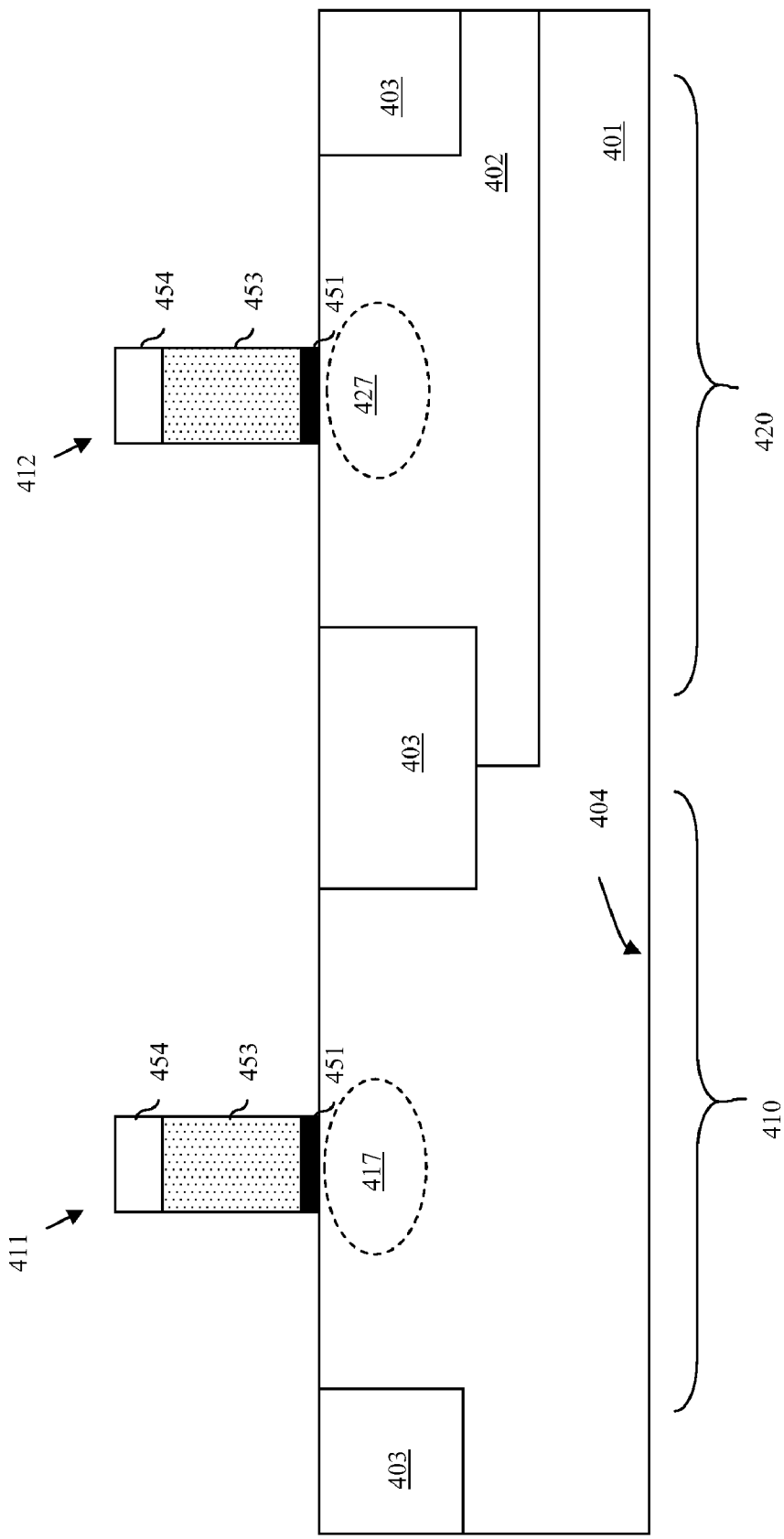
FIG. 21 is a cross-section diagram illustrating a partially-completed CMOS device formed according to the method of FIG. 18.

Then, gate stacks 411, 412 can be formed on the substrate 401. That is, a first gate stack 411 can be formed on the first section 410 over an area designated for a PFET channel region and a second gate stack 412 can be formed on the second section 420 adjacent to the PWELL 402 and, more particularly, over an area within the PWELL 402 designated for an NFET channel region (1808, see FIGS. 20-21). These gate stackes 411, 412 can be formed at approximately the same time or separately. For example, in order to form the gate stacks 411, 412 at process 1808, a gate dielectric layer 451 is formed on the substrate 401. This gate dielectric layer 451 can comprise a high-k dielectric layer. For example, the gate dielectric layer 751 can comprise a hafnium (Hf)-based material (e.g., HfO$_2$, HfSiO, HfSiON or HfAlO) or a nitrided silicon dioxide (SiO$_2$) (see FIG. 20). Then, a polysilicon layer 453 (e.g., an n-doped polysilicon layer or, optionally, an intrinsic polysilicon layer or p-doped polysilicon layer) is formed on the gate dielectric layer 451 and an oxide cap layer 454 is formed on the polysilicon layer 453 (see FIG. 22). Next, conventional lithographic patterning and etch processes are performed in order to form the gates stacks 411 and 412 above the first and second sections 410, 420, respectively, of the substrate 401 and, more specifically, above designated channel regions 417, 427 (see FIG. 21). Thus, each of the gate stacks 411, 412 initially comprises a gate dielectric layer 451 adjacent to the substrate 401, a polysilicon layer 453 adjacent to the gate dielectric layer 451 and an oxide cap layer 454 adjacent to the polysilicon layer 453. For CMOS technology generations at or beyond the 65 nm node, these gate stacks 411, 412 should be formed, as described above, such that they have a relatively high aspect ratio (i.e., such that the width-to-height ratio of the gate stacks is one to at least five).

Figure 22:
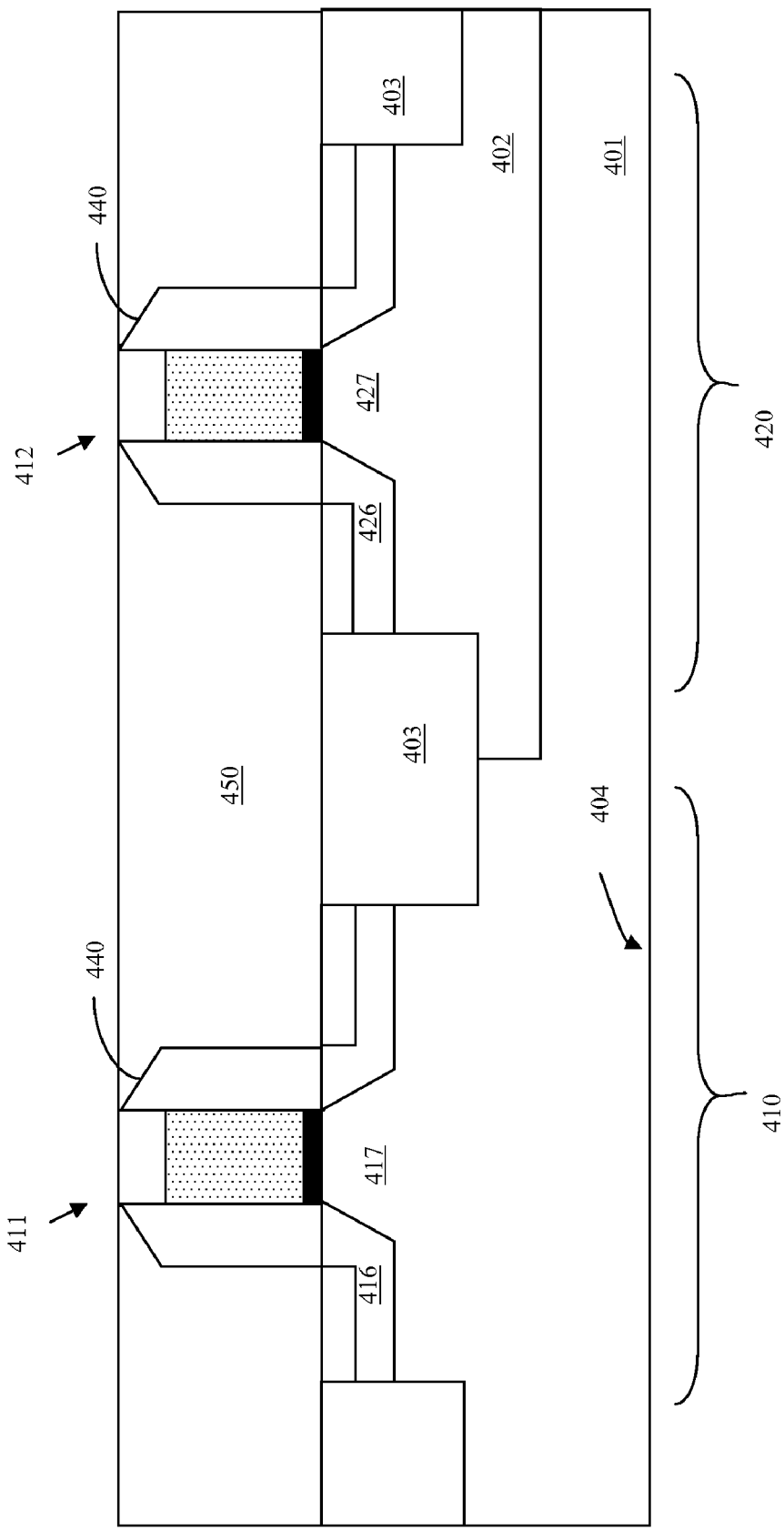
FIG. 22 is a cross-section diagram illustrating a partially-completed CMOS device formed according to the method of FIG. 18.

After the gate stacks 411, 412 are formed, conventional FET processing techniques can be performed so as to form a PFET structure in the first section 410 of the n-substrate 401 and an NFET structure in PWELL 402 of the second section 420 of the substrate 401 (1810, see FIG. 22). For example, this conventional FET processing can include, but is not limited to, PFET and NFET halo implantation, PFET and NFET source/drain extension implantation, gate stack sidewall spacer 440 formation, PFET and NFET source/drain region 416, 426 implantation, high temperature implant activation anneal, silicide formation, blanket dielectric layer 450 deposition and planarization, etc.). Specifically, using conventional sidewall spacer formation techniques, sidewall spacers 440 (e.g., nitride sidewall spacers) can be formed on the substrate 401 adjacent to the opposing sidewalls of each of the gate stacks 411, 412 such that they extend vertically from the bottom surface of the gate dielectric layer 451 to the top surface of the oxide layer 454.

Figure 23:
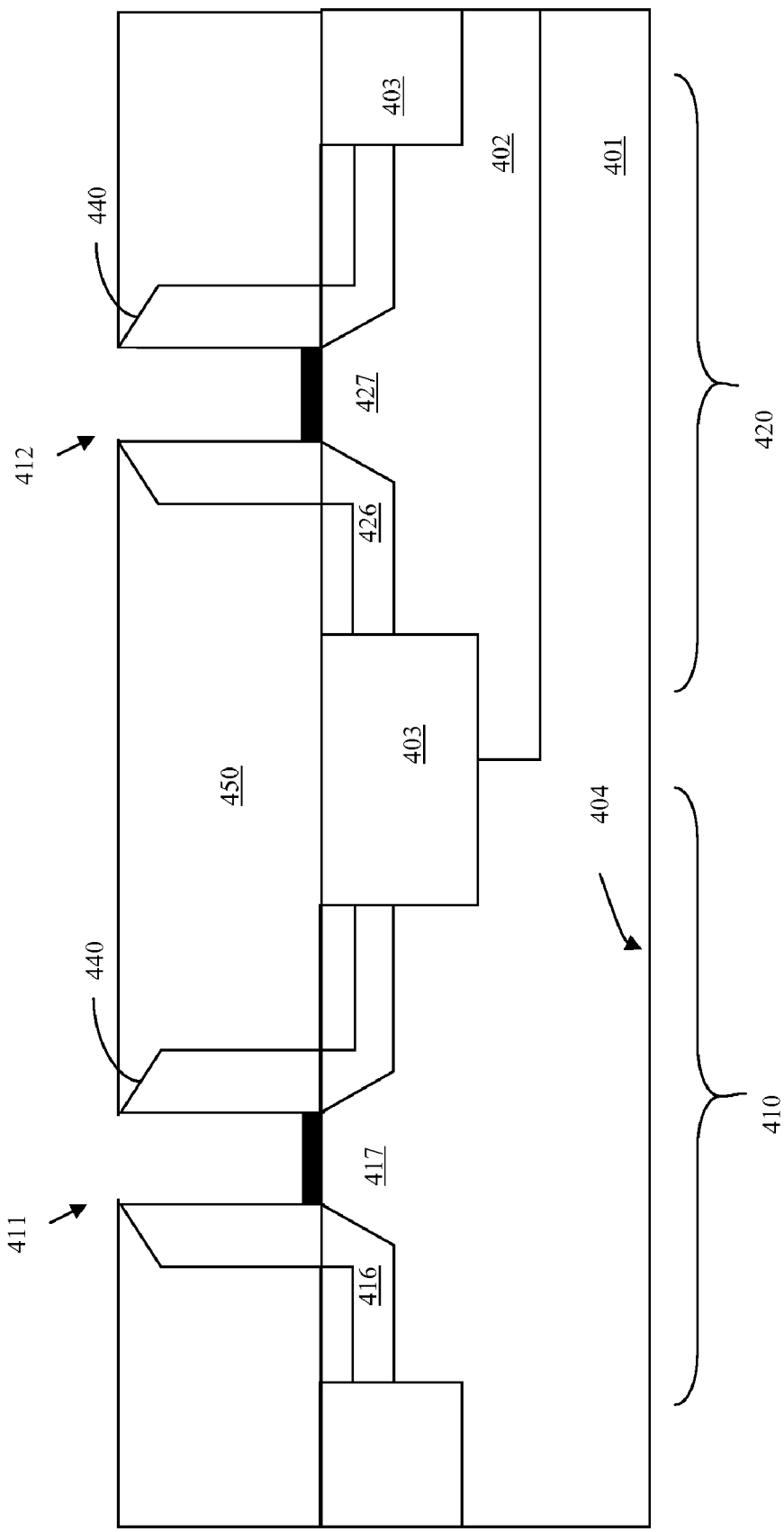
FIG. 23 is a cross-section diagram illustrating a partially-completed CMOS device formed according to the method of FIG. 18.

Once conventional FET processing is completed and, more particularly, once all high temperature processing (i.e., all processing over approximately 600° C.), such as high temperature implant activation anneals, are completed, then the polysilicon layer 453 is removed from above the gate dielectric layer 451 of each of the gate stacks 411, 412 (1812, see FIG. 23). Specifically, etch processes (e.g. wet or dry etch processes) can be performed in order to remove the oxide cap layer 454 and then, the polysilicon layer 453 from between the sidewall spacers 440 of the gate stack 411 and 412.

Figure 24:
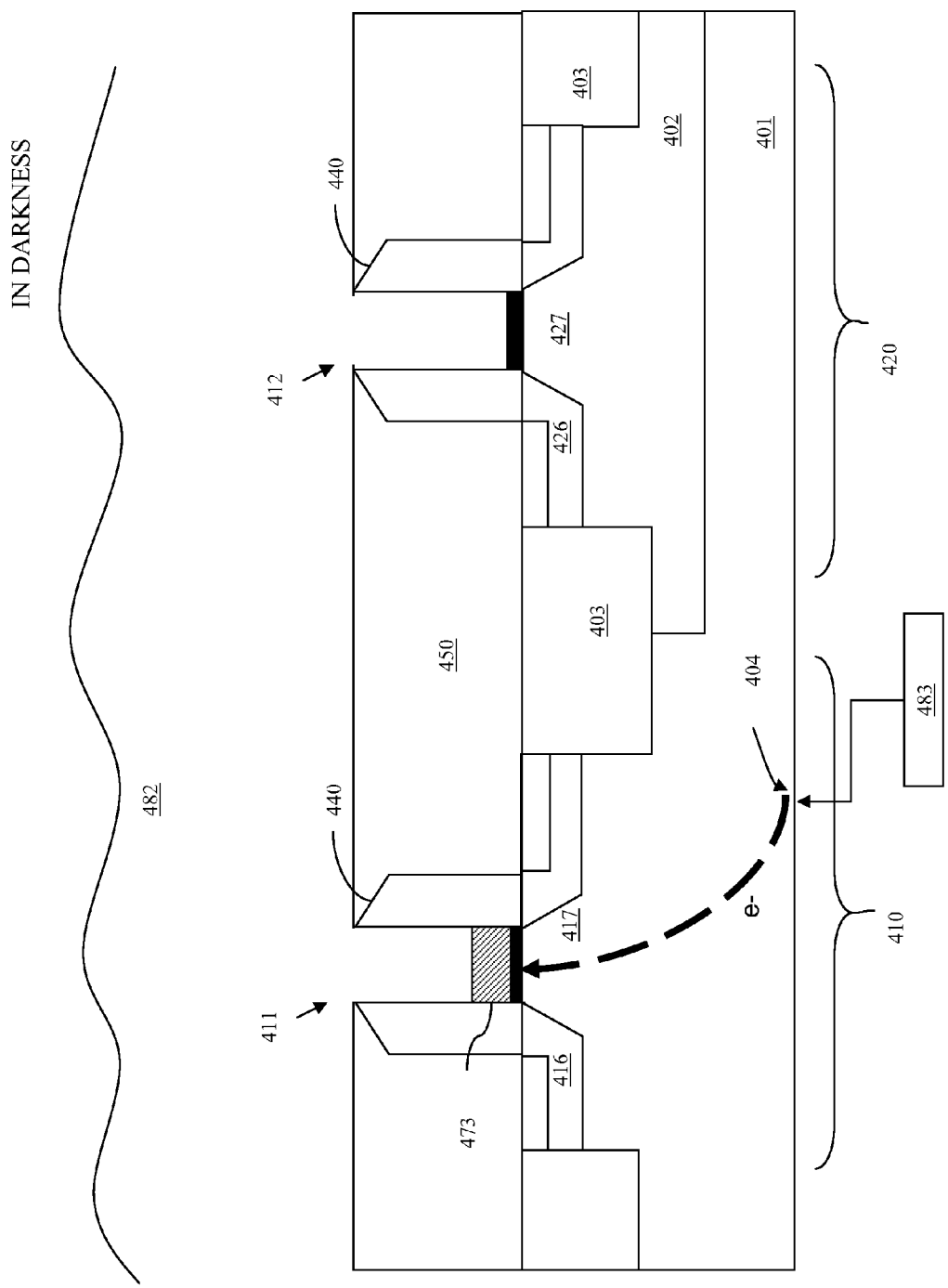
FIG. 24 is a cross-section diagram illustrating a partially-completed CMOS device formed according to the method of FIG. 18.

Then, a p-type metal gate conductor layer 473 can be selectively electroplated onto the gate dielectric layer 451 of the first gate stack 411 (1814, see FIG. 24) without applying photoresist mask. Specifically, the structure is placed in an electroplating bath with an electroplating solution 482 and an anode (i.e., a source for a p-type metal, such as rhenium (Re), platinum (Pt) or ruthenium (Ru), or for a conducting p-type metal oxide, such as $RuO_2$ or $Re_2O_3$). However, unlike conventional electroplating processes that require the use of a seed layer, the electroplating process 1814 of this embodiment applies a current from a power source 483 to the back side 404 of the substrate 401, thereby providing the required flow of electrons through the substrate 401 to the first gate stack 411 (i.e., through the gate dielectric layer 451 to allow plating on the gate dielectric layer 451 of the first gate stack 411). Furthermore, the electroplating is performed without the light illumination (i.e., under darkness) and with a positively biased electrolyte solution 482 so that a depletion layer is formed below the NFET gate dielectric and no current flows to the NFET gate stack 412. However, even in darkness, current and, thereby electrons will flow directly through the substrate 401 to the first gate stack 411 and no seed layer is required. Such a flow of electrons will cause p-type metal ions in the electroplating solution 482 to lose their charge and plate onto the dielectric layer 451 in the first gate stack 411. Since the p-type metal gate conductor layer 473 is plated from the bottom of the high aspect ratio gate stack opening upward, it is plated without voids or seams. Furthermore, since the p-type metal gate conductor layer 473 is plated without a seed layer, it is in direct contact with the gate dielectric layer 451 and the sidewall spacers 440. It should be noted that the required work function for the p-type metal gate conductor layer 473 can be achieved with a thickness of only a few tens of angstroms. Thus, the thickness of the p-type metal gate conductor layer 473 can be selectively controlled during the electroplating process so that it is, for example, between approximately $1/10^{th}$ to approximately $8/10$ths the overall height of the first gate stack 411. It should also be noted that, during this electroplating the second gate stack 412 can be masked by a photoresist mask.

Figure 25:
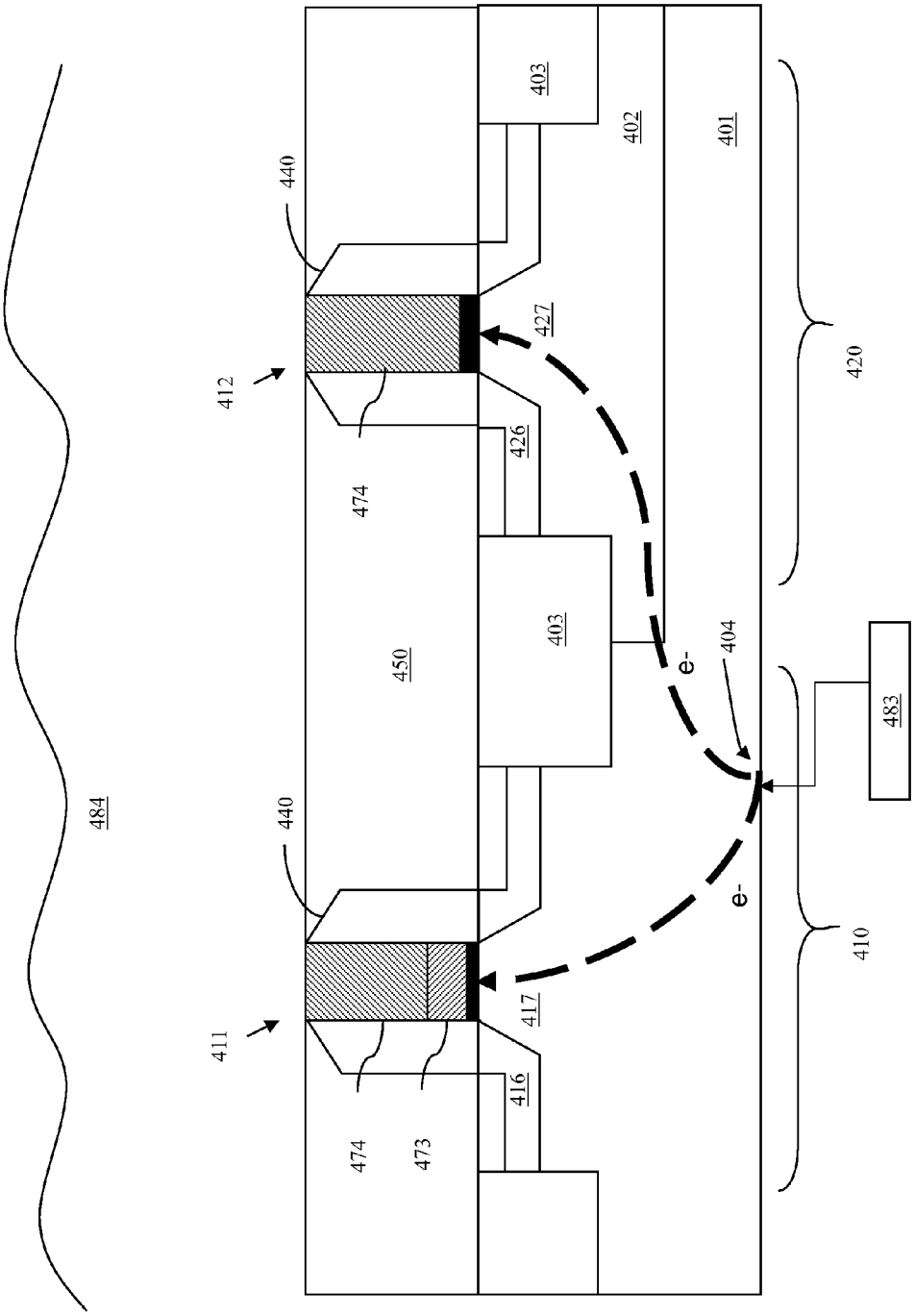
FIG. 25 is a cross-section diagram illustrating a partially-completed CMOS device formed according to the method of FIG. 18.

Once the p-type metal gate conductor layer 473 is plated onto the dielectric layer 451 in the first gate stack 411, an n-type metal gate conductor layer 474 can be electroplated onto both the p-type metal gate conductor layer 473 of the first gate stack 411 and onto the gate dielectric layer 451 of the second gate stack 412 (1816, see FIG. 25). Specifically, the structure is placed in an electroplating bath with an electroplating solution 484 and an anode (i.e., a source for an n-type metal, such as, hafnium (Hf), zirconium (Zr), titanium (Ti), tantalum (Ta) or aluminum (Al)). Again, unlike conventional electroplating processes that require the use of a seed layer, the electroplating process 1816 of this embodiment applies a current from a power source 483 to the back side 404 of the substrate 301, thereby providing the required flow of electrons through the substrate 301 to both the gate stacks 411 and 412 (i.e., through the gate dielectric layer 451 to allow plating in both stacks 411 and 412). However, this process should be performed under illumination and in a positively biased electroplating solution 484 so as to ensure that the electrons will flow between the n-type substrate 401 and the PWELL 402 to the second gate stack 412. Plating of the n-type metal layer 474 can continue until, for example, the remaining space between the sidewall spacers 440 of each of the gate stacks 411, 412 is filled with the n-type metal layer 474 for wiring.

Consequently, the method embodiment of FIG. 18 results in the CMOS structure 400 of FIG. 26. The CMOS device 400 comprises an n-type substrate 401, rather than a p-substrate. This n-substrate 401 comprises a first section 410 on which a PFET 419 is formed and a second section 420 on which NFET 429 is formed. The second section 420 can be positioned laterally adjacent to the first section 410 and these sections are separated (i.e., isolated from each other) by shallow trench isolation (STI) structures 403.

The PFET 419 comprises typical PFET components, including but not limited to, source/drain regions 416 (i.e., p-type diffusion regions) located at the top surface (i.e., the front side) of the substrate 401 and a channel region 417 positioned between the source/drain regions 416. The PFET 419 also comprises a PFET gate stack 411. This PFET gate stack 411 is positioned on the top surface of the substrate 401 and, more particularly, on channel region 417. Sidewall spacers 440 (e.g., nitride sidewall spacers) are positioned on opposing sidewalls of the gate stack 411. A blanket dielectric material 450 (e.g., an oxynitride material) is positioned above the substrate 401 and STIs 403 adjacent to the sidewall spacers 440. The PFET gate stack 411 has a relatively high aspect ratio (i.e., the width-to-height ratio of the gate stack is one to at least five). Furthermore, even with the high aspect ratio, the PFET gate stack 411 comprises a void-free and seam-free, p-type gate conductor metal layer 473.

Specifically, in this case the PFET gate stack 411 comprise a dual metal gate stack. That is, the PFET gate stack 411 comprises a gate dielectric layer 451 adjacent to the channel region 417. This gate dielectric layer 451 can comprise a high-k dielectric layer. For example, the gate dielectric layer 451 can comprise a hafnium (Hf)-based material (e.g., $HfO_2$, HfSiO, HfSiON or HfAlO) or a nitrided silicon dioxide ($SiO_2$). A p-type metal gate conductor layer 413 is positioned on the gate dielectric layer 412. This p-type metal gate conductor layer 473 can comprise a p-type metal (e.g., rhenium (Re), platinum (Pt), ruthenium (Ru), etc.) or a conducting p-type metal oxide (e.g., $RuO_2$, $Re_2O_4$, etc.). As discussed in detail above, this p-type metal gate conductor layer 473 can be formed using an electroplating process that flow current for a power source through the back side 404 of the substrate 401. Thus, during the electroplating process, electrons can flow directly through the substrate 401 to the PFET gate stack 411 without requiring a seed layer (i.e., the PFET gate stack 411 is devoid of any seed layers). This allows the electroplating process to fill a high aspect ratio PFET gate stack opening with the p-type gate conductor metal layer 473 from the bottom upward without voids or seams. It further ensures that the p-type metal gate conductor layer 473 is in direct contact with the gate dielectric layer 451 and the sidewall spacers 440. The thickness of the p-type metal layer 473 can be between approximately $1/10^{th}$ to approximately $8/10$ths the overall height of the PFET gate stack 411. The remaining portion of the high aspect ratio gate stack 411 between the sidewall spacers 440 and above the p-type metal gate conductor layer 473 comprises an electroplated, void-free and seam-free, n-type metal layer 474. This electroplated n-type metal layer 474 is similarly formed from the bottom upward without a seed layer and can comprise, for example, hafnium (Hf), zirconium (Zr), titanium (Ti), tantalum (Ta) or aluminum (Al).

As mentioned above, the CMOS device 400 of FIG. 26 further comprises an NFET 429 positioned in the second section 420 of the substrate 401. Specifically, this NFET 429 comprises a PWELL 402 located within the second section 420 of the substrate 401. This PWELL 402 is appropriately doped with a p-type dopant (e.g., boron (B)). The NFET 429 further comprises typical NFET components, including but not limited to, source/drain regions 426 (i.e., n-type diffusion regions) located within the PWELL 402 at the top surface of the substrate 401 and a channel region 427 positioned within the PWELL 402 between the source/drain regions 426. The NFET 429 also comprises an NFET gate stack 421. This NFET gate stack 421 similarly comprises a high aspect ratio stack (i.e., the width-to-height ratio of the gate stack is one to at least five). This NFET gate stack 421 is positioned on the top surface of the substrate 401 and, more particularly, on channel region 427 between the source/drain regions 426. Sidewall spacers 440 (e.g., nitride sidewall spacers) are positioned on opposing sidewalls of the gate stack 421. A blanket dielectric material 450 (e.g., an oxynitride material) is positioned above the substrate 401 and STIs 403 adjacent to the sidewall spacers 440. In this case, the NFET gate stack 421 comprises a gate dielectric layer 422 (i.e., a second gate dielectric layer) on the second section 420 of the substrate 401 directly adjacent to the channel region 427. This gate dielectric layer 422 can comprise, for example, the same high-k dielectric material used for the gate dielectric layer 412 in the PFET gate stack 411. The NFET gate stack 421 further comprises an electroplated, void-free and seam-free, n-type metal gate conductor layer 474 on the gate dielectric layer 451. This electroplated n-type metal layer 474 can comprise the same n-type metal layer as in the PFET gate stack 411. This n-type metal gate conductor layer 474 can fill the remaining portion of the high aspect ratio gate stack 412 between the sidewall spacers 440 above the gate dielectric layer 422 and can function as a wiring metal layer.

In the method embodiments described above, the electroplated p-type gate metal is formed from rhenium (Re), platinum (Pt), ruthenium (Ru), or a conducting p-type metal oxide, such as $RuO_2$ or $Re_2O_3$ and the electroplated n-type gate metal is formed from hafnium (Hf), zirconium (Zr), titanium (Ti), tantalum (Ta) or aluminum (Al)). However, it should be understood that that other suitable gate metal, gate metal alloys, gate metal mixtures, or multi-layers of the same may be electroplated according to processes described above in order to form the structures of FIGS. 8, 17 and 26 (e.g., U.S. Patent Application Publication No. 20060166474 of Vereecken et al. dated Jul. 27, 2006 and incorporated herein by reference, which contains a listing of exemplary metals, semiconductor materials, semiconducting oxides, conducting oxides, etc. capable of electroplated using through-gate dielectric current flow).

Therefore, disclosed above are embodiments of a method of forming a complementary metal oxide semiconductor (CMOS) device that has at least one high aspect ratio gate structure with a void-free and seam-free metal gate conductor layer positioned on top of a relatively thin high-k gate dielectric layer. These method embodiments incorporate a gate replacement strategy that uses an electroplating process to fill, from the bottom upward, a high-aspect ratio gate stack opening with a metal gate conductor layer. The source of electrons for the electroplating process is a current passed directly through the back side of the substrate. This eliminates the need for a seed layer and ensures that the metal gate conductor layer will be formed without voids or seams. Furthermore, depending upon the embodiment, the electroplating process is performed under illumination to enhance electron flow to a given area (i.e., to enhance plating) or in darkness to prevent electron flow to a given area (i.e., to prevent plating). These method embodiments will allow for future dimensional scaling of the high-k dielectric-metal gate conductor system as well as providing the benefit of low cost electrodeposition.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that these embodiments can be practiced with modification within the spirit and scope of the appended claims. For example, the electroplating processes described above provide wide flexibility, allowing single metal gate conductors (e.g., gate conductors comprising an n-type or p-type metal), dual metal gate conductors (e.g., gate conductors comprising both n-type and p-type metals), metal alloy gate conductors with varying compositions, etc. Furthermore, these gate conductors with different compositions can be stacked on a variety of different types of gate dielectrics.

What is claimed is:

1. A method of forming a semiconductor device, said method comprising:
   providing a p-type substrate, having a first section and a second section positioned laterally adjacent to said first section;
   forming an n-type well region in said first section;
   forming a first gate stack on said first section and a second gate stack on said second section, wherein said forming of said first gate stack and said second gate stack comprises:
      forming a dielectric layer adjacent to said substrate;
      forming an n-type metal layer adjacent to said dielectric layer;
      forming a polysilicon layer adjacent to said n-type metal layer; and
      patterning and etching said polysilicon layer, said n-type metal layer and said polysilicon layer so as to form said first gate stack and said second gate stack; and
   removing said polysilicon layer and said n-type metal layer from said first gate stack; and
   electroplating a p-type metal layer on said dielectric layer of said first gate stack, wherein said electroplating is performed with a current applied to said substrate and under illumination so as to ensure electron flow through said substrate and said n-type well region to said first gate stack.

2. The method according to claim 1, all the limitations of which are incorporated by reference, wherein said first gate stack and said second gate stack are formed such that said dielectric layer comprises a high-k dielectric layer.

3. The method according to claim 1, all the limitations of which are incorporated by reference, wherein said electroplating is performed without a seed layer such that said p-type metal layer is electroplated from said dielectric layer up without voids and seams and such that said p-type metal layer is in direct contact with said dielectric layer and with adjacent to sidewall spacers.

4. The method according to claim 1, all the limitations of which are incorporated by reference, further comprising, before said removing, forming first source/drain regions for a p-type transistor in said first section and second source/drain regions for an n-type transistor in said second section.

5. The method according to claim 1, all the limitations of which are incorporated by reference, wherein said first gate stack and said second gate stack are formed with a width-to-height ratio of one to at least five.

6. A method of forming a semiconductor device, said method comprising:
   providing a p-type substrate, having a first section and a second section positioned laterally adjacent to said first section;
   forming an n-type well region in said first section;
   forming a first gate stack on said first section and a second gate stack on said second section, wherein said forming of said first gate stack and said second gate stack comprises:
      forming a dielectric layer adjacent to said substrate;
      forming an n-type metal layer adjacent to said dielectric layer;
      forming a polysilicon layer adjacent to said n-type metal layer; and
      patterning and etching said polysilicon layer, said n-type metal layer and said polysilicon layer to form said first gate stack and said second gate stack;
   forming sidewall spacers adjacent to opposing sidewalls of said first gate stack and said second gate stack;
   removing said polysilicon layer and said n-type metal layer from said first gate stack;
   electroplating a p-type metal layer on said dielectric layer of said first gate stack, wherein said electroplating is performed with a current applied to said substrate and under illumination so as to ensure electron flow through said substrate and said n-type well region to said first gate stack; and
   after said electroplating, filling, with a wiring metal layer, a space above said p-type metal layer between said sidewall spacers of said first gate stack.

7. The method according to claim 6, all the limitations of which are incorporated by reference, wherein said first gate stack and said second gate stack are formed such that said dielectric layer comprises a high-k dielectric layer.

8. The method according to claim 6, all the limitations of which are incorporated by reference, wherein said electroplating is performed without a seed layer such that said p-type metal layer is electroplated from said dielectric layer up without voids and seams and such that said p-type metal layer is in direct contact with said dielectric layer and said sidewall spacers.

9. The method according to claim 6, all the limitations of which are incorporated by reference, further comprising, before said removing, forming first source/drain regions for a p-type transistor in said first section and second source/drain regions for an n-type transistor in said second section.

10. The method according to claim 6, all the limitations of which are incorporated by reference, wherein said first gate stack and said second gate stack are formed with a width-to-height ratio of one to at least five.

11. A method of forming a semiconductor device, said method comprising:
   providing a p-type substrate, having a first section and a second section positioned laterally adjacent to said first section;
   forming an n-type well region in said first section;
   forming a first gate stack on said first section and a second gate stack on said second section, wherein said forming of said first gate stack and said second gate stack comprises:
      forming a dielectric layer adjacent to said substrate;
      forming a polysilicon layer adjacent to said dielectric layer; and
      patterning and etching said polysilicon layer and said dielectric layer to form said first gate stack and said second gate stack;
   forming sidewall spacers adjacent to opposing sidewalls of said first gate stack and said second gate stack;
   removing said polysilicon layer from said first gate stack and said second gate stack;
   masking said second gate stack and electroplating a p-type metal layer on said dielectric layer of said first gate stack, wherein said electroplating of said p-type metal layer is performed with a current applied to said substrate and under illumination so as to ensure electron flow through said substrate and said n-type well region to said first gate stack; and
   masking said first gate stack and electroplating an n-type metal layer on said dielectric layer of said second gate stack.

12. The method according to claim 11, all the limitations of which are incorporated by reference, wherein said first gate stack and said second gate stack are formed such that said dielectric layer comprises a high-k dielectric layer.

13. The method according to claim 11, all the limitations of which are incorporated by reference, wherein said electroplating of said p-type metal layer and said electroplating of said n-type metal layer are performed without seed layers such that said p-type metal layer is electroplated from said dielectric layer of said first gate stack up without voids and seams and such that said n-type metal layer is electroplated from said dielectric layer of said second gate stack up without voids and seams.

14. The method according to claim 11, all the limitations of which are incorporated by reference, further comprising, after said electroplating of said p-type metal layer and said electroplating of said n-type metal layer, filling, with a wiring metal layer, spaces above said p-type metal layer between said sidewall spacers of said first gate stack and above said n-type metal layer between said sidewall spacers of said second gate stack.

15. The method according to claim 11, all the limitations of which are incorporated by reference, further comprising, before said removing, forming first source/drain regions for a p-type transistor in said first section and second source/drain regions for an n-type transistor in said second section.

16. The method according to claim 11, all the limitations of which are incorporated by reference, wherein said first gate stack and said second gate stack are formed with a width-to-height ratio of one to at least five.

17. A method of forming a semiconductor device, said method comprising:

providing an n-type substrate, having a first section and a second section positioned laterally adjacent to said first section;
forming a p-type well region in said second section;
forming a first gate stack on said first section and a second gate stack on said second section, wherein said forming of said first gate stack and said second gate stack comprises:
forming a dielectric layer adjacent to said substrate;
forming a polysilicon layer adjacent to dielectric layer; and
patterning and etching said polysilicon layer and said dielectric layer to form said first gate stack and said second gate stack;
forming sidewall spacers adjacent to opposing sidewalls of said first gate stack and said second gate stack;
removing said polysilicon layer from said first gate stack and said second gate stack;
selectively electroplating a p-type metal layer on said dielectric layer of said first gate stack, wherein said selectively electroplating of said p-type metal layer is performed with a current applied to said substrate and in darkness so as to allow electron flow through said substrate to said first gate stack and to prevent electron flow through said p-type well region to said second gate stack; and
after said selectively electroplating of said p-type metal layer, electroplating an n-type metal layer on said p-type metal layer of said first gate stack and on said dielectric layer of said second gate stack, wherein said electroplating of said n-type metal layer is performed under illumination so as to ensure electron flow through said substrate and said p-type well region to said second gate stack.

18. The method according to claim 17, all the limitations of which are incorporated by reference, wherein said first gate stack and said second gate stack are formed such that said dielectric layer comprises a high-k dielectric layer.

19. The method according to claim 17, all the limitations of which are incorporated by reference, wherein said electroplating of said p-type metal layer and said electroplating of said n-type metal layer are performed without seed layers such that said p-type metal layer is electroplated from said dielectric layer of said first gate stack up without voids and seams and such that said n-type metal layer is electroplated from said p-type metal layer of said first gate stack and from said dielectric layer of said second gate stack up without voids and seams.

20. The method according to claim 17, all the limitations of which are incorporated by reference, further comprising, before said removing, forming first source/drain regions for a p-type transistor in said first section and second source/drain regions for an n-type transistor in said second section.

21. The method according to claim 17, all the limitations of which are incorporated by reference, wherein said first gate stack and said second gate stack are formed with a width-to-height ratio of one to at least five.

22. A method of forming a semiconductor device, said method comprising:
providing an n-type substrate, having a first section and a second section positioned laterally adjacent to said first section;
forming a p-type well region in said second section;
forming a first gate stack on said first section and a second gate stack on said second section, wherein said forming of said first gate stack and said second gate stack comprises:
forming a dielectric layer adjacent to said substrate;
forming a polysilicon layer adjacent to dielectric layer; and
patterning and etching said polysilicon layer and said dielectric layer to form said first gate stack and said second gate stack;
forming sidewall spacers adjacent to opposing sidewalls of said first gate stack and said second gate stack;
removing said polysilicon layer from said first gate stack and said second gate stack;
selectively electroplating a p-type metal layer on said dielectric layer of said first gate stack, wherein said selectively electroplating of said p-type metal layer is performed with a current applied to said substrate and in darkness so as to allow electron flow through said substrate to said first gate stack and to prevent electron flow through said p-type well region to said second gate stack; and
after said selectively electroplating of said p-type metal layer, electroplating an n-type metal layer on said p-type metal layer of said first gate stack and on said dielectric layer of said second gate stack so as to fill a space between said sidewalls spacers of said first gate stack and said second gate stack, wherein said electroplating of said n-type metal layer is performed under illumination so as to ensure electron flow through said substrate and said p-type well region to said second gate stack.

23. The method according to claim 22, all the limitations of which are incorporated by reference, wherein said first gate stack and said second gate stack are formed such that said dielectric layer comprises a high-k dielectric layer.

24. The method according to claim 22, all the limitations of which are incorporated by reference, wherein said electroplating of said p-type metal layer and said electroplating of said n-type metal layer are performed without seed layers such that said p-type metal layer is electroplated from said dielectric layer of said first gate stack up without voids and seams and such that said n-type metal layer is electroplated from said p-type metal layer of said first gate stack and from said dielectric layer of said second gate stack up without voids and seams.

25. The method according to claim 22, all the limitations of which are incorporated by reference, wherein said first gate stack and said second gate stack are formed with a width-to-height ratio of one to at least five.

* * * * *